US012176369B2

(12) United States Patent
Shimizu et al.

(10) Patent No.: US 12,176,369 B2
(45) Date of Patent: Dec. 24, 2024

(54) PHOTOELECTRIC CONVERSION APPARATUS HAVING OVERLAPPED PARTS OF CHARGE HOLDING PORTIONS, IMAGING SYSTEM, AND MOVABLE BODY

(71) Applicant: CANON KABUSHIKI KAISHA, Tokyo (JP)

(72) Inventors: Shinichiro Shimizu, Kanagawa (JP); Kazutoshi Torashima, Kanagawa (JP); Masahiro Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/330,975

(22) Filed: Jun. 7, 2023

(65) Prior Publication Data

US 2023/0335570 A1    Oct. 19, 2023

Related U.S. Application Data

(63) Continuation of application No. 17/357,437, filed on Jun. 24, 2021, now Pat. No. 11,710,755.

(30) Foreign Application Priority Data

Jun. 25, 2020 (JP) .................. 2020-109435

(51) Int. Cl.
*H01L 27/146* (2006.01)
*B60R 11/04* (2006.01)

(52) U.S. Cl.
CPC ........ *H01L 27/14627* (2013.01); *B60R 11/04* (2013.01); *H01L 27/14621* (2013.01); *H01L 27/14638* (2013.01)

(58) Field of Classification Search
CPC ........... H01L 27/14607; H01L 27/1461; H01L 27/14614; H01L 27/14621;
(Continued)

(56) References Cited

U.S. PATENT DOCUMENTS

2022/0052088 A1* 2/2022 Yoshita ............. H01L 27/14612

FOREIGN PATENT DOCUMENTS

JP        2001-250931 A   9/2001
JP        2004111590 A    4/2004
(Continued)

*Primary Examiner* — Lin Ye
*Assistant Examiner* — Chriss S Yoder, III
(74) *Attorney, Agent, or Firm* — Canon U.S.A., Inc. IP Division

(57) ABSTRACT

A photoelectric conversion apparatus includes pixels having adjacent first and second pixels. The pixels each include, in a semiconductor layer of a substrate, a photoelectric conversion portion that generates charges, a charge holding portion that holds the charges, and a floating diffusion layer that converts the charges into a voltage. At least parts of the charge holding portion in the first pixel and the floating diffusion layer in the second pixel, parts of the charge holding portion in the first pixel and the charge holding portion in the second pixel, and/or parts of the floating diffusion layer in the first pixel and the floating diffusion layer in the second pixel overlap each other without physically touching each other in a depth direction of the substrate in a state where a region for separating the at least parts of the charge holding portions and the floating diffusion layers is provided therebetween.

8 Claims, 20 Drawing Sheets

(58) Field of Classification Search
CPC ......... H01L 27/14623; H01L 27/14627; H01L 27/14638; H01L 27/1464; B60R 11/04
See application file for complete search history.

(56) References Cited

FOREIGN PATENT DOCUMENTS

| | | | |
|---|---|---|---|
| JP | 2011082330 | A | 4/2011 |
| JP | 2013065688 | A | 4/2013 |
| JP | 2013080797 | A | 5/2013 |
| JP | 2014-116472 | A | 6/2014 |
| JP | 2016103541 | A | 6/2016 |
| JP | 2016-139660 | A | 8/2016 |
| JP | 2016-152417 | A | 8/2016 |
| JP | 2017-220877 | A | 12/2017 |
| JP | 2019169668 | A | 10/2019 |
| JP | 2020-047826 | A | 3/2020 |
| WO | 2017-126326 | A1 | 7/2017 |

* cited by examiner

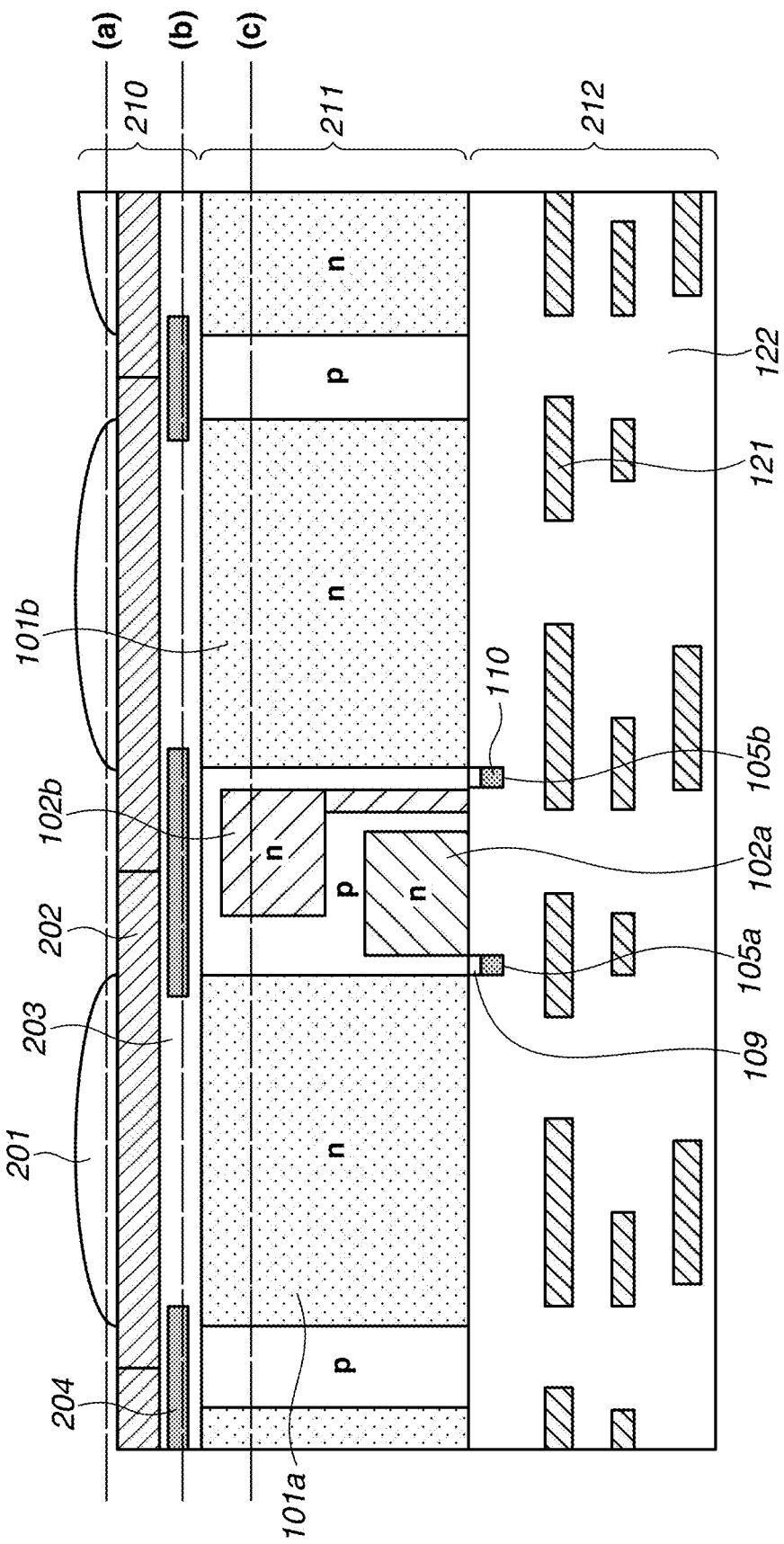

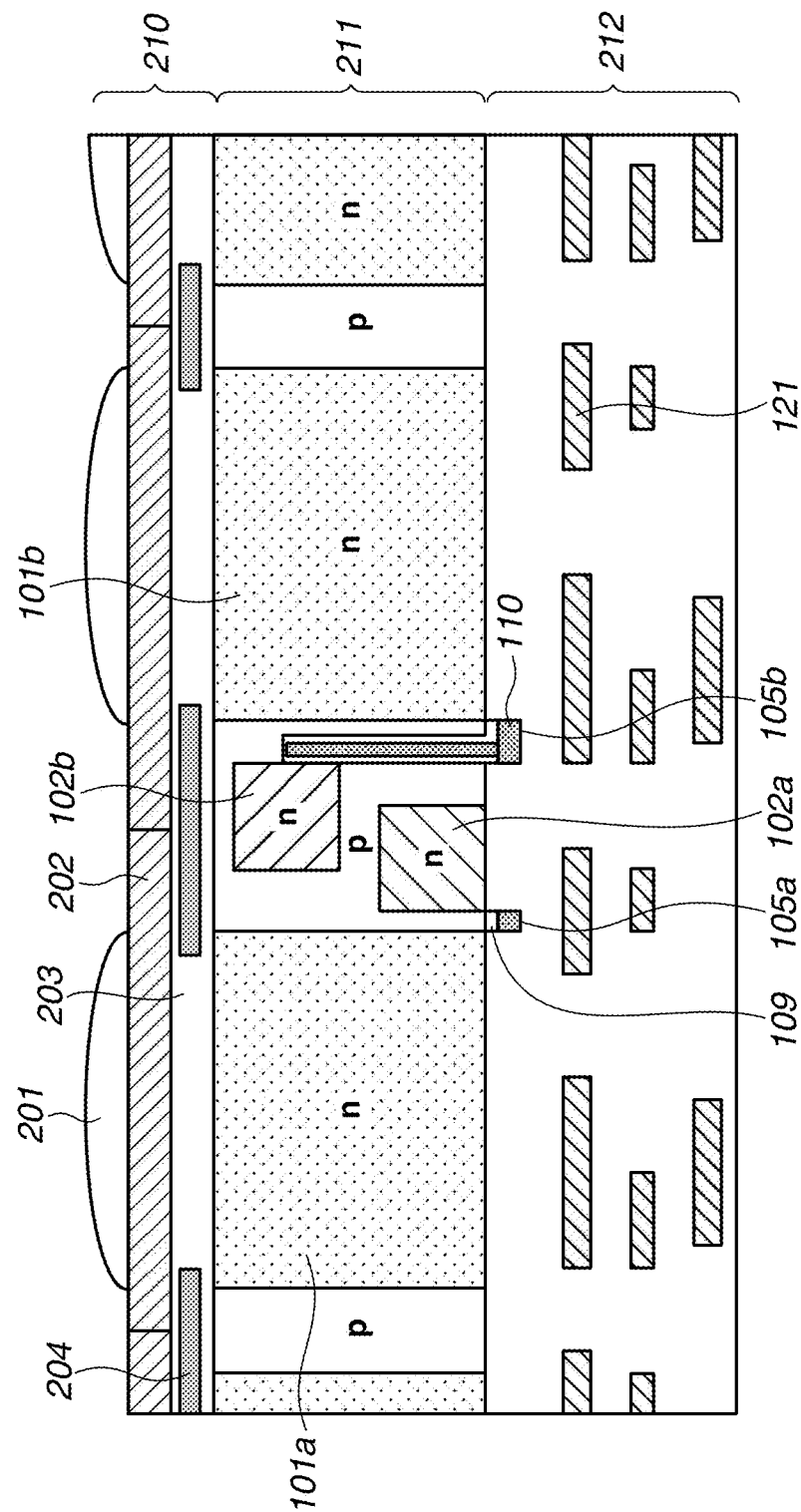

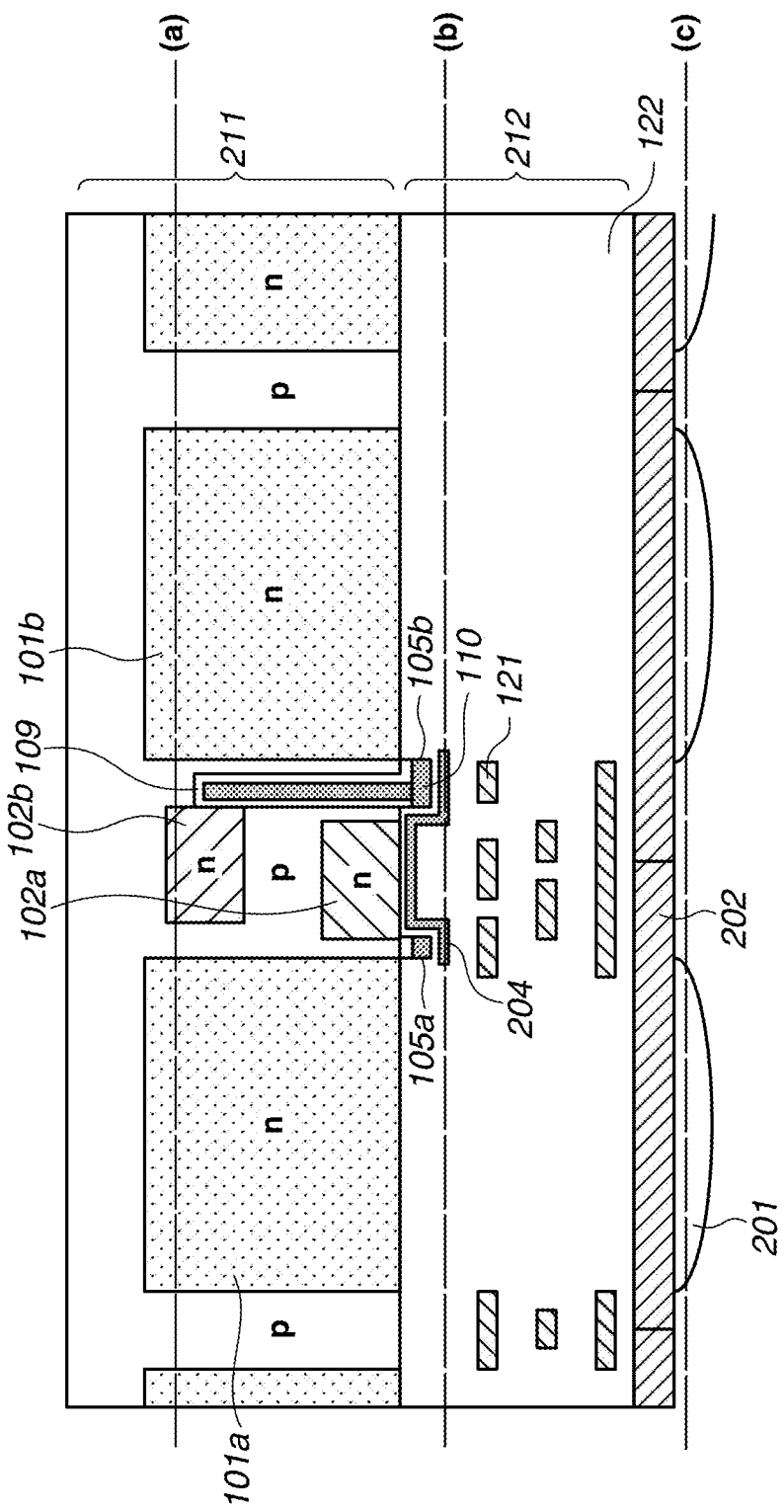

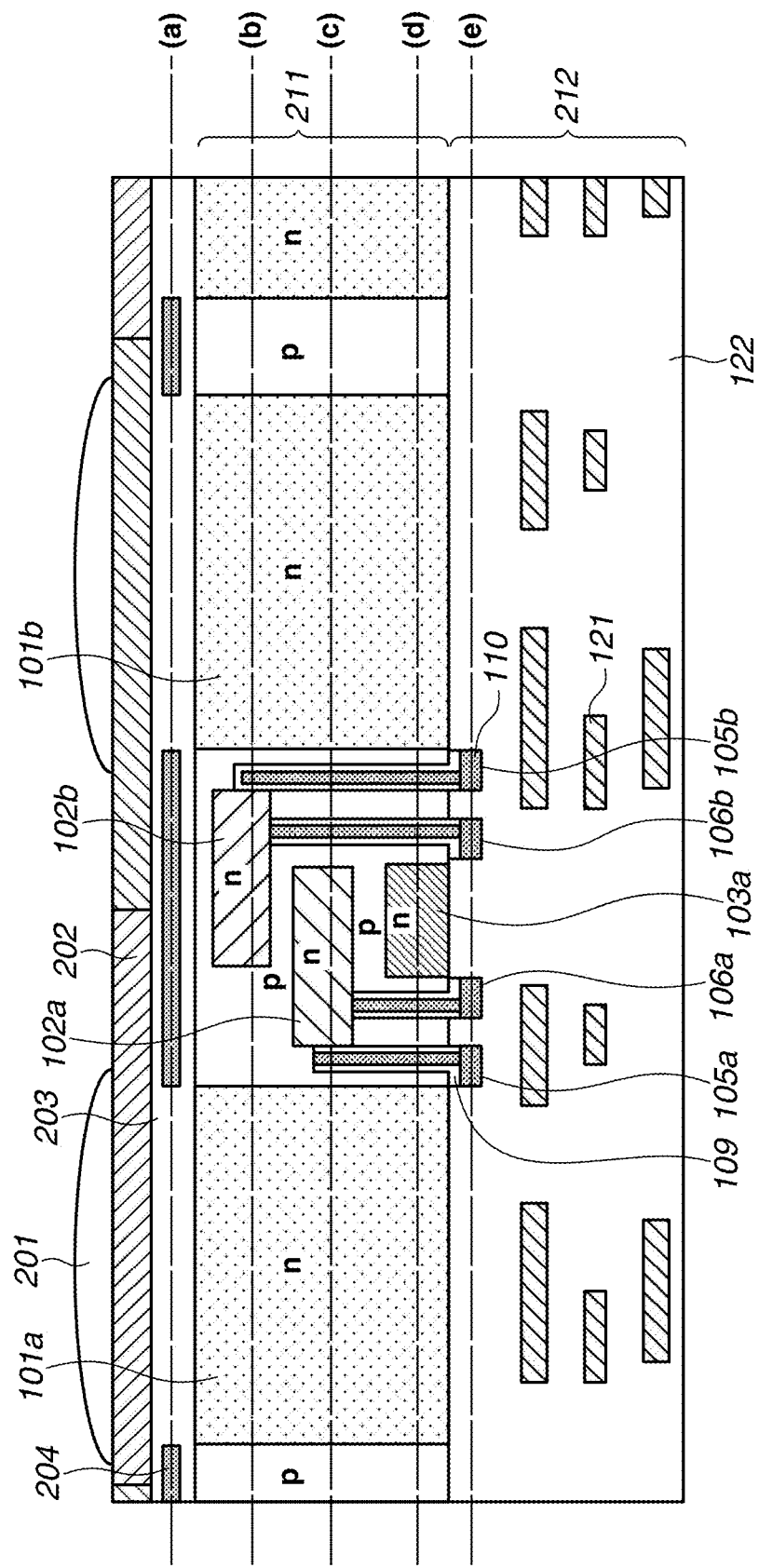

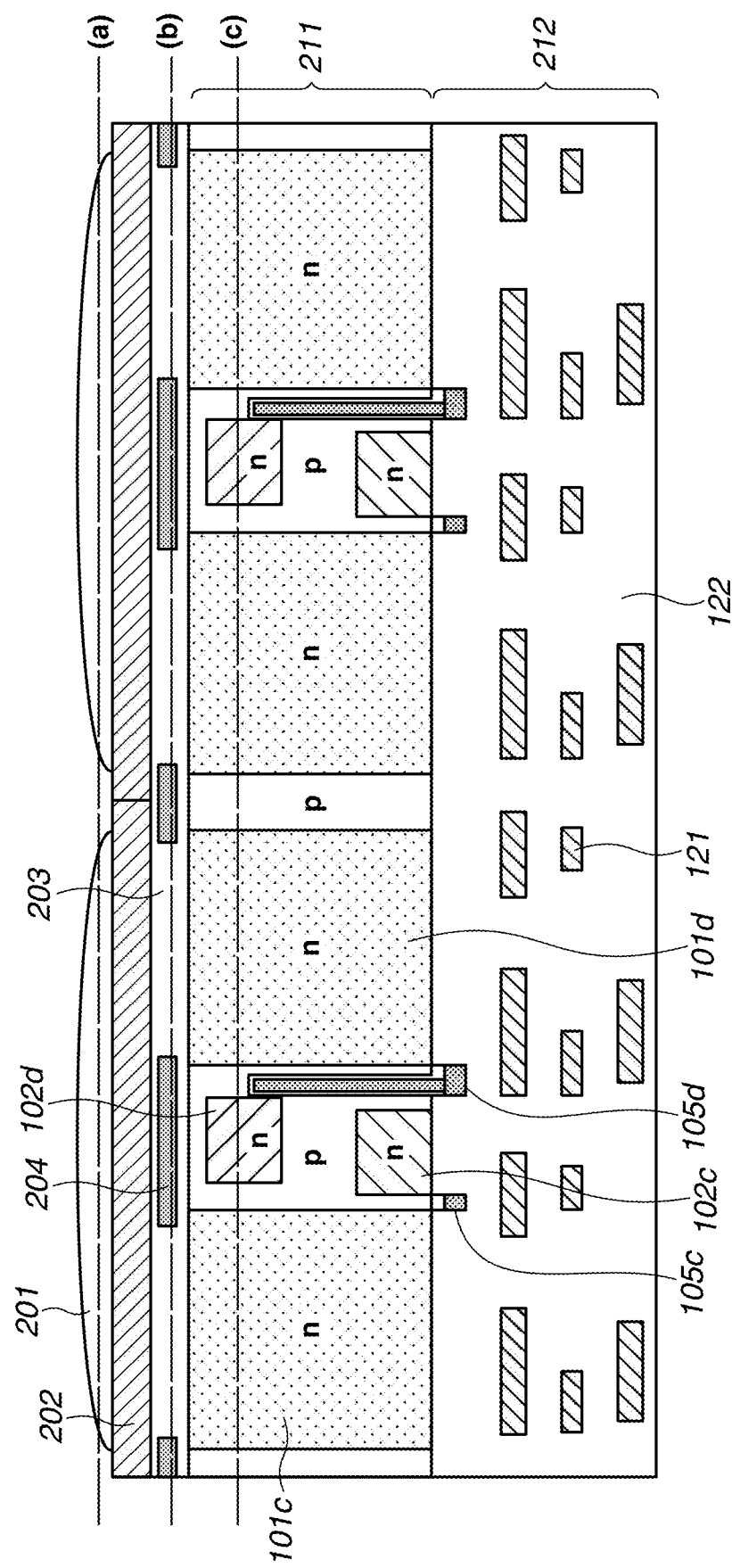

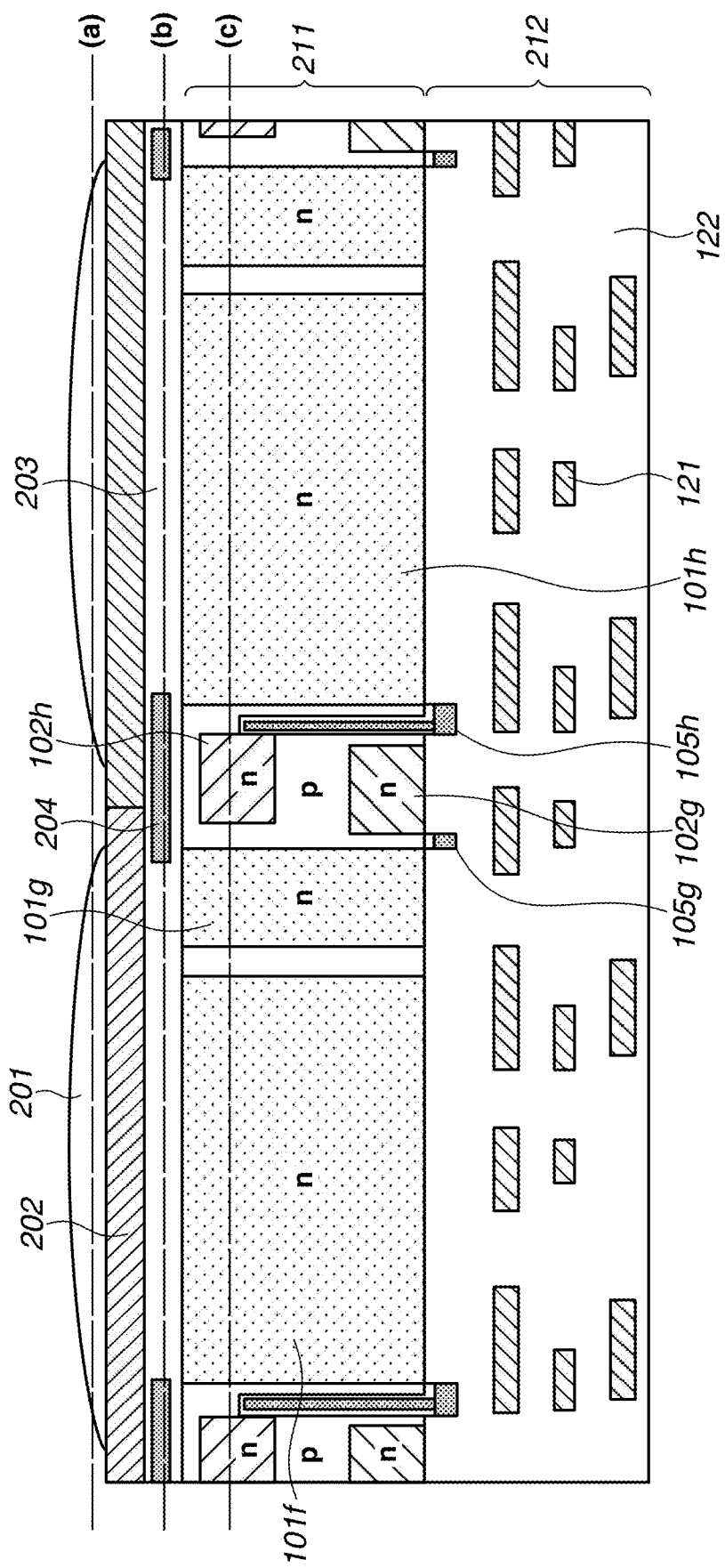

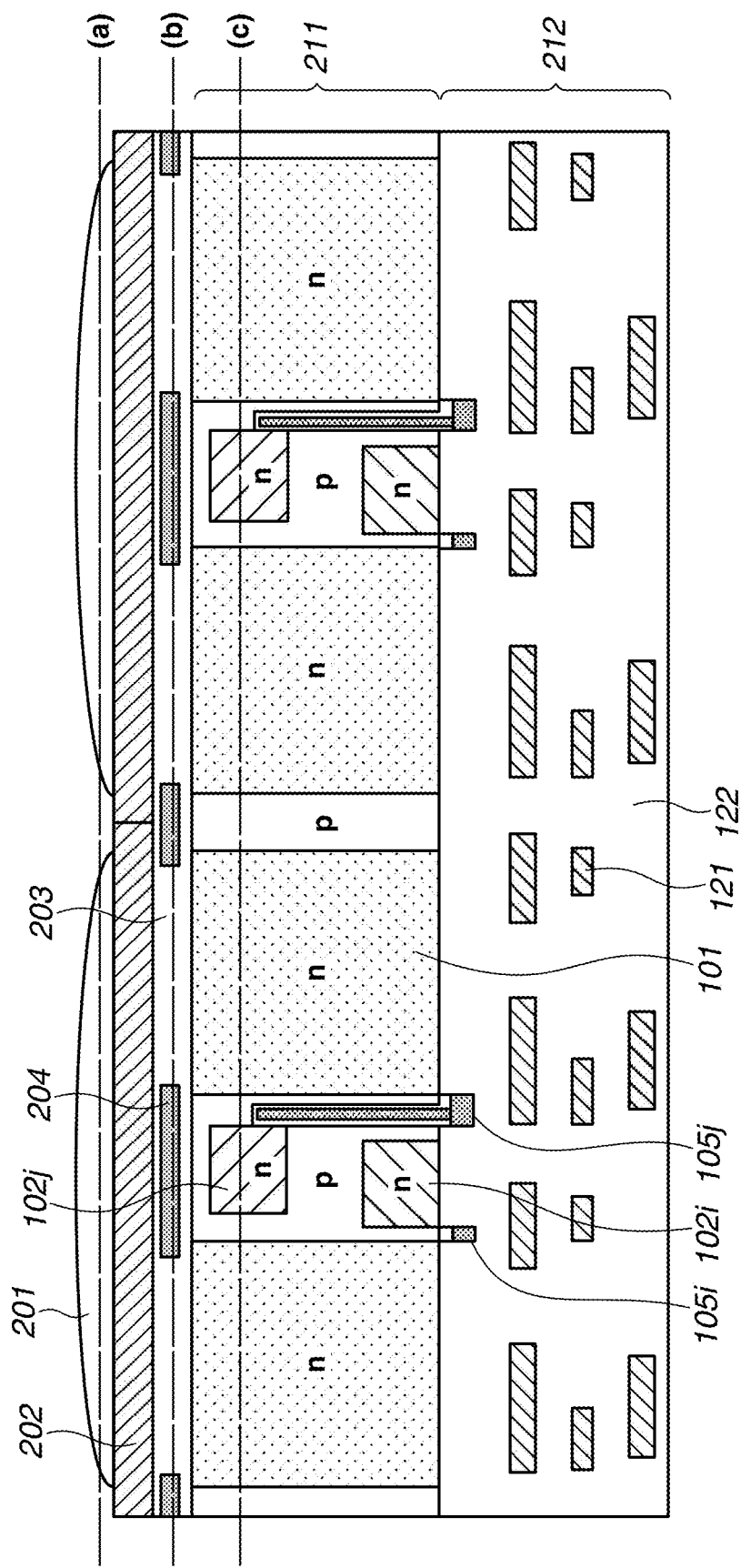

PHOTOELECTRIC CONVERSION APPARATUS HAVING OVERLAPPED PARTS OF CHARGE HOLDING PORTIONS, IMAGING SYSTEM, AND MOVABLE BODY

CROSS-REFERENCE TO RELATED APPLICATION

This application is a Continuation of U.S. application Ser. No. 17/357,437, filed Jun. 24, 2021, which claims priority from Japanese Patent Application No. 2020-109435, filed Jun. 25, 2020, which is hereby incorporated by reference herein in its entirety.

BACKGROUND

Technical Field

One disclosed aspect of the embodiments relates to a photoelectric conversion apparatus having overlapped parts of charge holding portions, an imaging system, and a movable body.

Description of the Related Art

For photoelectric conversion apparatuses represented by complementary metal oxide semiconductor (CMOS) image sensors, Japanese Patent Application Laid-Open No. 2013-065688 discusses an imaging method in which a global electronic shutter operation is performed. In addition, Japanese Patent Application Laid-Open No. 2004-111590 discusses a back-side illuminated CMOS image sensor capable of performing the global electronic shutter operation.

When a global electronic shutter is implemented, components such as a charge holding portion and a light-shielding member are required. This affects the area and aperture ratio of a photoelectric conversion portion and degrades the sensitivity and dynamic range performance.

SUMMARY

One aspect of the embodiments is directed to providing a photoelectric conversion apparatus having enhanced sensitivity and dynamic range performance.

According to an aspect of the disclosure, a photoelectric conversion apparatus includes a plurality of pixels having a first pixel and a second pixel adjacent to the first pixel. Each of the plurality of pixels includes, in a semiconductor layer of a substrate, a photoelectric conversion portion, a charge holding portion configured to hold charges generated by the photoelectric conversion portion, and a floating diffusion layer configured to convert the charges transferred from the charge holding portion into a voltage. At least a part of the charge holding portion in the first pixel and a part of the floating diffusion layer in the second pixel, a first part of the charge holding portion in the first pixel and a second part of the charge holding portion in the second pixel, and/or a first part of the floating diffusion layer in the first pixel and a second part of the floating diffusion layer in the second pixel are arranged to overlap each other without physically touching each other in a depth direction of the substrate in a state where a region for separating the at least parts of the charge holding portions and the floating diffusion layers is provided therebetween.

According to another aspect of the disclosure, a photoelectric conversion apparatus includes a plurality of pixels each including a plurality of sub pixels and a micro lens shared by the plurality of sub pixels. Each of the plurality of sub pixels includes, in a semiconductor layer of a substrate, a photoelectric conversion portion, a charge holding portion configured to hold charges generated by the photoelectric conversion portion, and a floating diffusion layer configured to convert the charges transferred from the charge holding portion into a voltage. At least parts of the charge holding portions and the floating diffusion layers in an adjacent plurality of the sub pixels are arranged to overlap each other without physically touching each other in a depth direction of the substrate in a state where a region for separating the at least parts of the charge holding portions and the floating diffusion layers is provided therebetween.

According to yet another aspect of the disclosure, a photoelectric conversion apparatus includes pixels each including, in a semiconductor layer of a substrate, a photoelectric conversion portion, a first charge holding portion configured to hold charges from the photoelectric conversion portion, and a second charge holding portion configured to hold charges from the photoelectric conversion portion. At least parts of the first and second charge holding portions are arranged to overlap each other without physically touching each other in a depth direction of the substrate in a state where a region for separating the at least parts of the first and second charge holding portions is provided therebetween.

Further features of the disclosure will become apparent from the following description of exemplary embodiments with reference to the attached drawings.

BRIEF DESCRIPTION OF THE DRAWINGS

FIG. 3 is a schematic diagram illustrating a cross-sectional structure of a pixel region of the photoelectric conversion apparatus according to the first exemplary embodiment.

FIG. 4 is a schematic diagram illustrating a cross-sectional structure of a pixel region of a photoelectric conversion apparatus according to a second exemplary embodiment.

FIG. 6 is a schematic diagram illustrating a cross-sectional structure of a pixel region of a photoelectric conversion apparatus according to a third exemplary embodiment.

FIG. 8 is a schematic diagram illustrating a cross-sectional structure of a pixel region of a photoelectric conversion apparatus according to a fourth exemplary embodiment.

FIG. 10 is a schematic diagram illustrating a cross-sectional structure of a pixel region of a photoelectric conversion apparatus according to a fifth exemplary embodiment.

FIG. 14 is a schematic diagram illustrating a cross-sectional structure of a pixel region of a photoelectric conversion apparatus according to a sixth exemplary embodiment.

FIG. 16 is a schematic diagram illustrating a cross-sectional structure of a pixel region of a photoelectric conversion apparatus according to a seventh exemplary embodiment.

DESCRIPTION OF THE EMBODIMENTS

Figure 1:
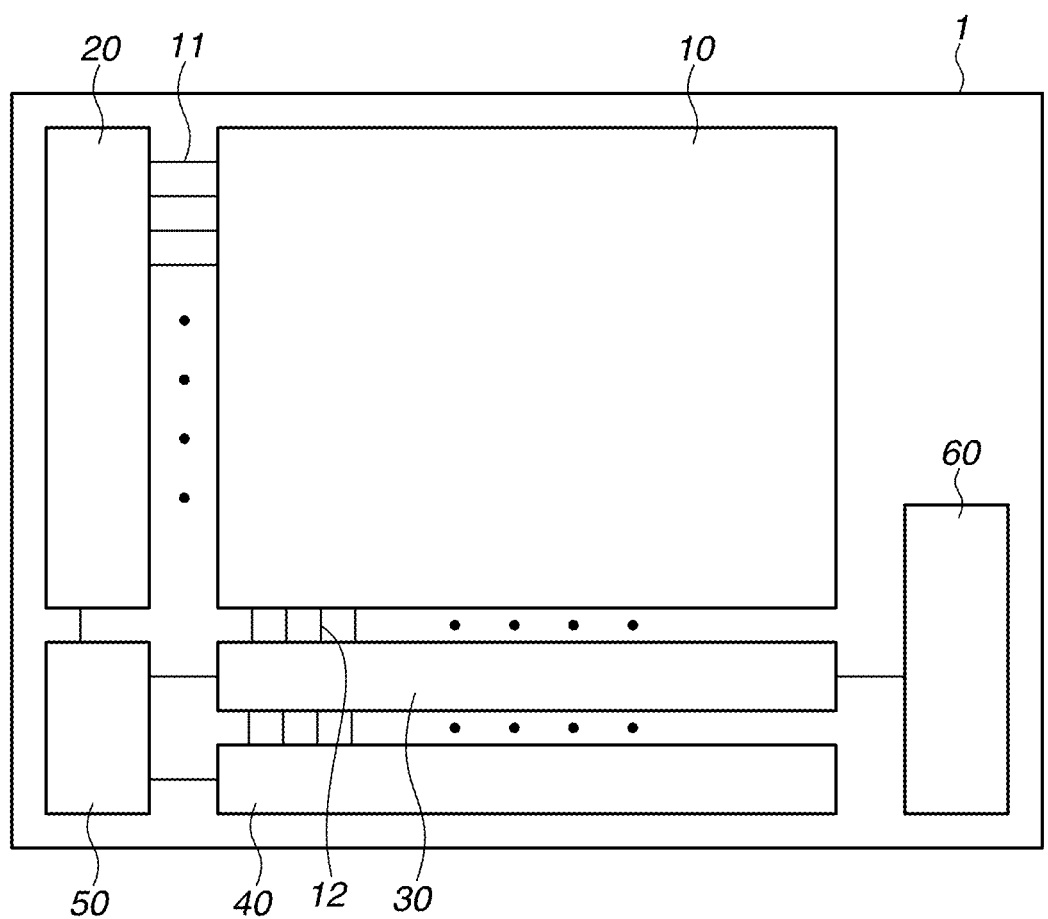
FIG. 1 is a schematic diagram illustrating a photoelectric conversion apparatus according to a first exemplary embodiment.

Exemplary embodiments will be described below with reference to the accompanying drawings. FIG. 1 is a schematic diagram illustrating a configuration of a photoelectric conversion apparatus 1 according to a first exemplary embodiment.

The photoelectric conversion apparatus 1 illustrated in FIG. 1 includes a pixel region 10, a vertical scanning unit 20, a readout circuit 30, a horizontal scanning unit 40, a control unit 50, and an output unit 60. The pixel region 10 includes unit pixels 100 (see FIG. 2) arranged, positioned, or disposed in a matrix form. Each of the unit pixels 100 includes a photoelectric conversion portion (photodiode or PD) 101 (see FIG. 2) that generates charges corresponding to the amount of incident light. Each row of the pixel array of the pixel region 10 is provided with a control signal line 11 that extends in the row direction (horizontal direction in FIG. 1). The control signal line 11 for each row is connected to each of the corresponding unit pixels 100 arranged in the row direction, and form a signal line common to these unit pixels 100. Each column of the pixel array of the pixel region 10 is provided with a vertical output line 12 that extends in the column direction (vertical direction in FIG. 1). The vertical output line 12 for each column is connected to each of the corresponding unit pixels 100 arranged in the column direction, and form a signal line common to these unit pixels 100.

The number of unit pixels 100 included in the pixel region 10 is not specifically limited. For example, the pixel region 10 may include the unit pixels 100 in several thousands of rows and several thousands of columns, like a standard digital camera, or may include the unit pixels 100 arranged in one row or one column. Alternatively, one unit pixel 100 may constitute the pixel region 10.

The control signal line 11 for each row is connected to the vertical scanning unit 20. The vertical scanning unit 20 is a circuit unit that supplies, to each of the unit pixels 100 via the control signal line 11, control signals for driving the vertical output line 12 within the unit pixel 100 in order to read pixel signals from the pixel region 10.

One end of the vertical output line 12 for each column is connected to the readout circuit 30. The pixel signals read from the unit pixels 100 are input to the readout circuit 30 via the corresponding vertical output lines 12. The readout circuit 30 can include a memory for holding the pixel signals read from the unit pixels 100.

The horizontal scanning unit 40 is a circuit unit that supplies to the readout circuit 30 a control signal for sequentially transferring the pixel signals held by the readout circuit 30 to the output unit 60 on a column-by-column basis. The control unit 50 is a circuit unit that supplies control signals for controlling the operations of the vertical scanning unit 20, the readout circuit 30, and the horizontal scanning unit 40, and the timings of the operations.

The configuration and connection of each of the unit pixels 100 according to the present exemplary embodiment will be described next.

Figure 2:
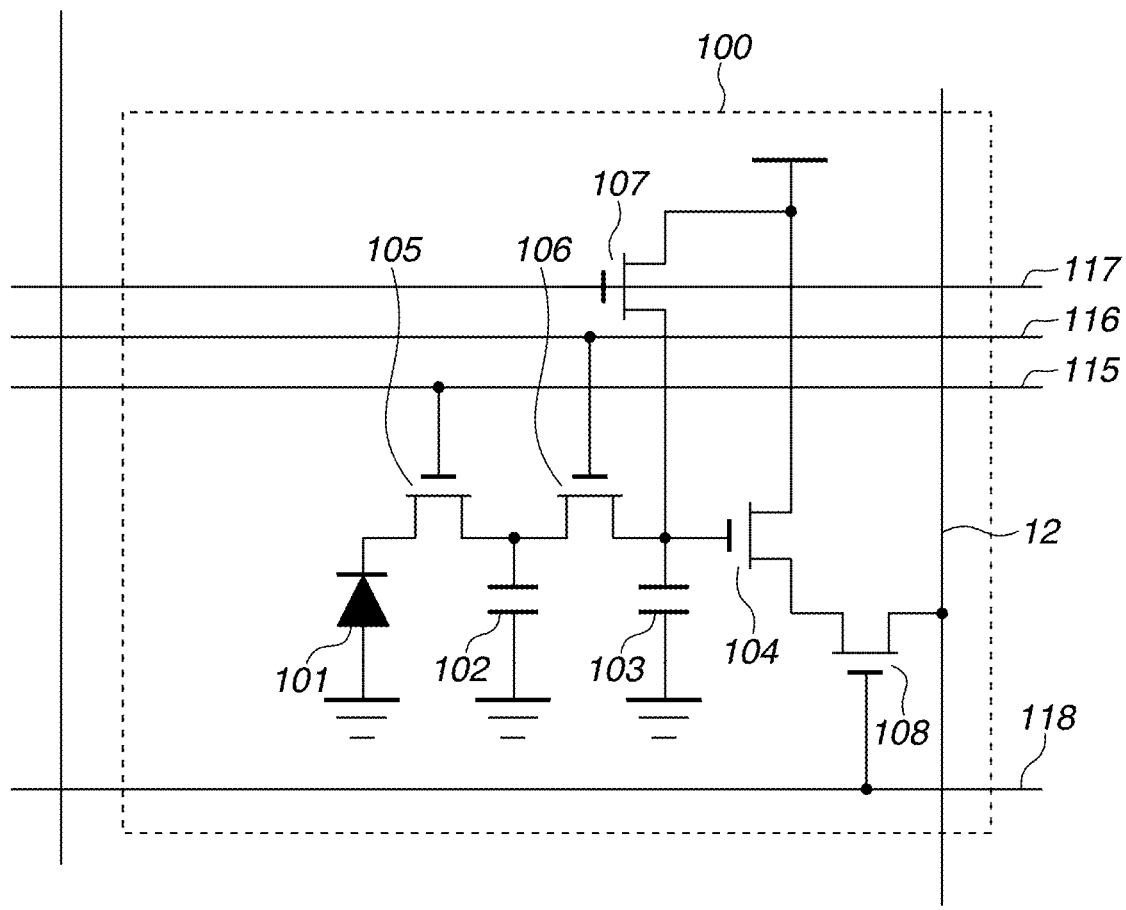
FIG. 2 is a diagram illustrating a configuration example of a pixel circuit of the photoelectric conversion apparatus according to the first exemplary embodiment.

FIG. 2 illustrates an example of the configuration of the pixel circuit of the unit pixel 100. The unit pixel 100 includes the photoelectric conversion portion (PD) 101, a charge holding portion used as a memory (MEM) 102, a floating diffusion layer (FD) 103, an amplification portion 104, a first transfer transistor 105, a second transfer transistor 106, a reset transistor 107, and a selection transistor 108.

The anode of the PD 101, one end of the MEM 102, and one end of the FD 103 are connected to the ground potential. The cathode of the PD 101 is connected to the source of the first transfer transistor 105. The drain of the first transfer transistor 105 is connected to the MEM 102. The MEM 102 is connected to the source of the second transfer transistor 106. The drain of the second transfer transistor 106 is connected to the FD 103. The FD 103, the source of the reset transistor 107, and the gate of the amplification portion 104 have the same node. The drain of the amplification portion 104 is connected to the source of the selection transistor 108.

The functions of the components of the unit pixel 100 will be described next.

The PD 101 photoelectrically converts incident light to generate charges. The generated charges are transferred to the MEM 102 via the first transfer transistor 105 and then held by the MEM 102. The MEM 102 transfers the held charges to the FD 103 via the second transfer transistor 106. The FD 103 holds the charges transferred from the MEM 102, and also has a function of converting the held charges into a voltage signal. The amplification portion 104 is a source follower metal oxide semiconductor (MOS) transistor that amplifies the voltage signal generated by the FD 103 to read the signal as a pixel signal. The reset transistor 107 resets the voltage level of the FD 103 to a reference voltage. The selection transistor 108 connects the output terminal of the amplification portion 104 and the vertical output line 12, which is the input terminal of the readout circuit 30, to output the pixel signal.

The first transfer transistor 105, the second transfer transistor 106, the reset transistor 107, and the selection transistor 108 are controlled by the control signals supplied via the control signal line 11, more specifically, control signal lines 115, 116, 117, and 118, respectively, which are connected from the vertical scanning unit 20.

The structure of the pixel region 10 according to the present exemplary embodiment will be described with reference to FIGS. 3 and 5A to 5C. The unit pixels 100 according to the present exemplary embodiment correspond to pixels in a back-side illuminated complementary metal oxide semiconductor (CMOS) sensor.

FIG. 3 is a schematic diagram illustrating a cross-sectional structure of a part of the pixel region 10 including two adjacent ones of the unit pixels 100. FIGS. 3 and 5A to 5C schematically illustrate the structure of the cross section and the structures on the rear side of the cross section. The photoelectric conversion apparatus 1 according to the present exemplary embodiment is an imaging apparatus, more specifically, a back-side illuminated CMOS image sensor. As illustrated in FIG. 3, the cross-sectional structure can be roughly divided into three different portions: a light receiving portion 210, a semiconductor layer 211, and a wiring layer 212 in the order from the light incidence side.

Figure 5A:
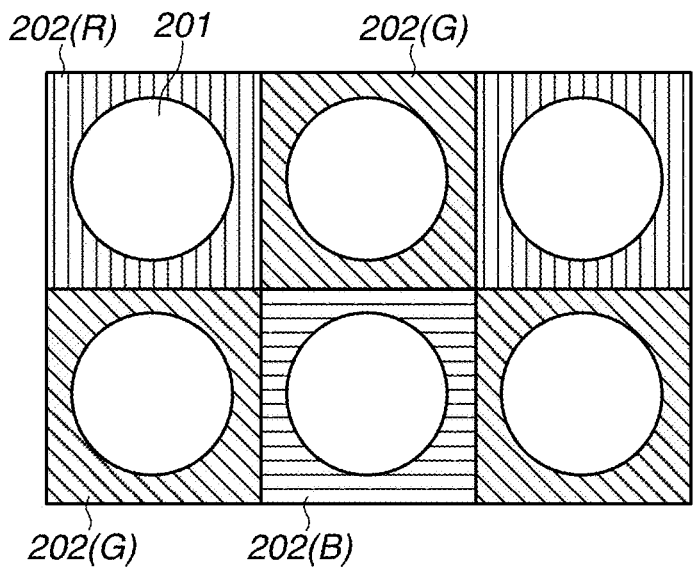
FIGS. 5A to 5C are schematic diagrams each illustrating a planar structure of the pixel region of the photoelectric conversion apparatus according to the first and second exemplary embodiments.
Figure 5B:
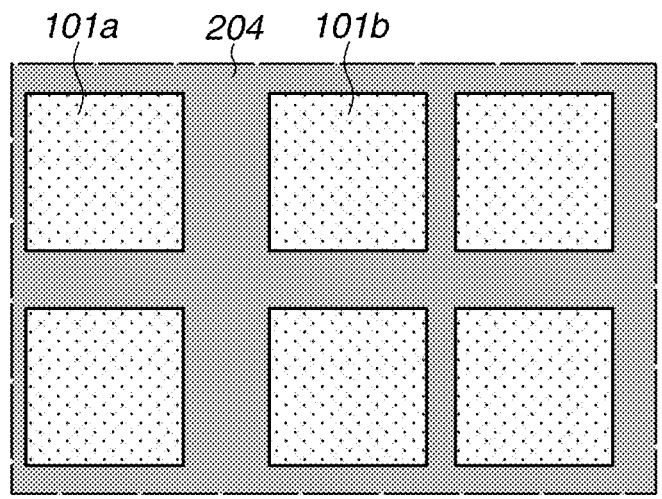
Figure 5C:
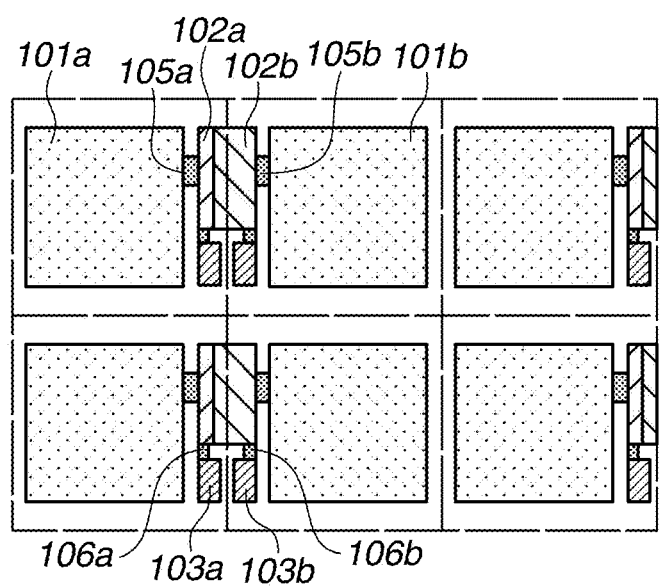

FIGS. 5A to 5C each schematically illustrate a planar structure of a part of the pixel region 10 including two or more of the unit pixels 100, which is viewed from the light incidence side. FIGS. 5A to 5C correspond to cross sections taken along section lines (a) to (c) in FIG. 3, respectively, and FIGS. 3 and 5A to 5C schematically illustrate the structures of the cross sections.

The configuration of the light receiving portion 210 will be described next.

Micro lenses 201, color filters 202, a dielectric layer 203, and a light shielding layer 204 are formed on the light incidence side of the semiconductor layer 211.

Generally, each of the color filters 202 corresponds to one of the red (R), green (G), and blue (B) wavelength bands and is formed for each of the unit pixels 100. The color filters 202 are thus arranged in a Bayer array as illustrated in FIG. 5A.

The light shielding layer 204 is sectionally disposed between the color filters 202 and the semiconductor layer 211, as illustrated in FIG. 3. The light shielding layer 204 planarly has openings corresponding to the light incidence surfaces of the PDs 101 (101a and 101b) as illustrated in FIG. 5B, and is formed so as to cover the MEMs 102 (102a and 102b) and the FDs 103 (103a and 103b). As the light shielding layer 204, a light-shielding conductor formed of a material such as tungsten or aluminum is used to block the incidence of light into the MEMs 102 and the FDs 103 that are light-sensitive elements other than the PDs 101.

The dielectric layer 203 is formed at the openings of the light shielding layer 204, between the light shielding layer 204 and the semiconductor layer 211, and between the light shielding layer 204 and the color filters 202. The dielectric layer 203 insulates the semiconductor layer 211 and flattens the surface on which the color filters 202 and the micro lenses 201 are to be formed.

The configuration of the semiconductor layer 211 will be described next.

The semiconductor layer 211 is formed to include the PDs 101, the MEMs 102, and the FDs 103. As the semiconductor layer 211, a silicon semiconductor substrate having a p-conductivity type is used, for example.

The PDs 101 are each formed, for example, by p-n junction of a p-type substrate and an n-type impurity region that is formed by doping phosphorus or arsenic into the p-type substrate. The PDs 101 are each disposed from the light incidence surface side to the wiring layer 212 side of the semiconductor layer 211.

The MEMs 102 and the FDs 103 are formed of n-type (first conductivity type) impurity regions.

The arrangement configurations of the MEMs 102 and the FDs 103 will be described next.

Referring to FIG. 3, the MEM 102a corresponding to the PD 101a included in one of the adjacent unit pixels 100 is formed on the wiring layer 212 side of the semiconductor layer 211. The MEM 102b corresponding to the PD 101b included in the other unit pixel 100 is partly formed on the wiring layer 212 side of the semiconductor layer 211, and is partly formed at a position of the semiconductor layer 211 closer to the light receiving portion 210 than the MEM 102a. As illustrated in FIG. 5C, the MEMs 102a and 102b are formed to partially overlap each other without physically touching each other in the depth direction in a state where a p-type semiconductor region for separating the MEMs 102a and 102b, is provided between the overlapping parts of the MEMs 102a and 102b. This configuration allows the MEMs 102 to be arranged in a smaller area, as compared with a configuration in which the MEMs 102a and 102b are arranged, positioned, or disposed so as not to overlap each other in the depth direction. In this configuration, impurities are doped between the parts of the MEMs 102a and 102b overlapping in the depth direction, so that a p-type (second conductivity type) region is provided therebetween.

The FD 103a corresponding to the PD 101a, and the FD 103b corresponding to the PD 101b are arranged on the wiring layer 212 side of the semiconductor layer 211. While in the present exemplary embodiment, the FDs 103 are formed of n-type impurity regions, the FDs 103 may be formed of wiring capacitance of wirings 121 in the wiring layer 212.

In the present exemplary embodiment, the MEMs 102 and the FDs 103 have an n-conductivity type (first conductivity type), and the region between the parts of the MEMs 102a and 102b overlapping in the depth direction of the substrate has a p-conductivity type (second conductivity type). However, in some photoelectric conversion apparatuses or imaging apparatuses, the first conductivity type may be a p-type and the second conductivity type may be an n-type. This also applies to second to seventh exemplary embodiments (described below).

The configuration of the wiring layer 212 will be described next.

The wiring layer 212 includes the wirings 121, an interlayer insulating film 122, gate insulating films 109, and gate electrodes 110, and is formed on the surface of the semiconductor layer 211 on the side opposite to the light incidence side. The plurality of wirings 121 for controlling the gate voltages of the transistors disposed in the semiconductor layer 211 and for reading the signal charges generated by photoelectric conversion is embedded in the interlayer insulating film 122.

The wirings 121 are formed of a conductive material such as aluminum or copper, and the interlayer insulating film 122 is formed of a material such as silicon oxide. FIG. 3 illustrates an example of a three-layer structure of the wirings 121. Although not illustrated, vias formed of, for example, tungsten are used to connect the wirings 121 in the respective layers and connect the wirings 121 and the gate electrodes 110.

The gate electrodes 110 are disposed between the wirings 121 in the wiring layer 212 and the semiconductor layer 211 via the gate insulating films 109, and the first transfer transistors 105 (105a and 105b) are each formed between the PD 101 and the MEM 102. When a predetermined voltage is applied to the gate electrodes 110 of the first transfer transistors 105, the charges generated by the PDs 101 are transferred to the MEMs 102. The gate insulating films 109 are formed of a material such as silicon oxide, and the gate electrodes 110 are formed of a material such as polysilicon.

Although not illustrated in FIG. 3, the second transfer transistors 106, the reset transistors 107, the selection transistors 108, and the amplification portions 104 can also be configured with the gate electrodes 110 formed in the wiring layer 212, similarly to the first transfer transistors 105.

As described above, the arrangement efficiency of the components such as the MEMs 102 and the FDs 103 can be enhanced by arranging the MEMs 102a and 102b in the adjacent unit pixels 100 so as to partially overlap each other in the depth direction of the semiconductor layer 211 (in the depth direction of the substrate). With this configuration, the region occupied by the PD 101, i.e., the photoelectric conversion region can be increased as compared with a conventional configuration in which the unit pixels 100 are arranged with the same pitches. Accordingly, it is possible to increase the photoelectric conversion sensitivity and the charge amount that can be accumulated in the photoelectric conversion portion 101. This configuration also reduces the region where light shielding by the light shielding layer 204 is required, making it possible to increase the aperture ratio of the light incidence surface of the PD 101, thereby enhancing the photoelectric conversion efficiency.

Not all the unit pixels 100 in the pixel region 10 need to have the structure according to the present exemplary embodiment. Some pixels in the pixel region 10 may be the unit pixels 100 according to the present exemplary embodiment.

In the examples of FIGS. 3 and 5A to 5C according to the present exemplary embodiment, a part of the MEM 102a and a part of the MEM 102b in the adjacent unit pixels 100 are arranged, positioned, or disposed to overlap each other in the depth direction of the semiconductor layer 211 in a state where a region for separating the MEMs 102a and 102b, which has a conductivity type different from that of the MEMs 102a and 102b, is provided therebetween. Alternatively, parts of the FDs 103a and 103b in the adjacent unit pixels 100 may be arranged, positioned, or disposed to overlap each other in the depth direction. In this case, a region having a conductivity type different from that of the FDs 103a and 103b is provided between the parts of the FDs 103a and 103b. In this case, it is not necessary to make the MEMs 102 or the MEMs 102 and the FDs 103 overlap in the depth direction. Furthermore, the region for separating the MEMs 102 (or the FDs 103) is not limited to a semiconductor region having a conductivity type different from that of the MEMs 102 (or the FDs 103). For example, the region may be an insulator region, or may be a semiconductor region having the same conductivity type as that of the MEMs 102 (or the FDs 103) but having a different impurity density from that of the MEMs 102 (or the FDs 103). In other words, a potential barrier is provided to restrict the movement of charges between the components. This also applies to the second to seventh exemplary embodiments (described below).

In the above-described configuration, there may be a case where a characteristic difference may occur between the transfers from the PDs 101 to the MEMs 102 or between the transfers from the MEMs 102 to the FDs 103 because of the structure difference between the unit pixels 100 and may affect the pixel signals to be output. To address this, for example, the positional relationships between the color filters 202 and the MEMs 102 are adjusted to reduce the influence of the characteristic difference.

As a specific example thereof, in a case where the RGB color filters 202 are arranged in a Bayer array, the MEMs 102 of the unit pixels 100 in which the R color filters 202 or the B color filters 202 are disposed are uniformly formed at positions of the semiconductor layer 211 that face the wiring layer 212. On the other hand, the MEMs 102 of the unit pixels 100 in which the G color filters 202 are disposed are uniformly formed at positions of the semiconductor layer 211 that are close to the light receiving portion 210. In such a configuration, no characteristic difference occurs between signals of the same color. The characteristic difference between signals of different colors can be corrected through white balance adjustment that is regularly performed in output signal processing.

As another example thereof, the unit pixels 100 corresponding to the R color, the unit pixels 100 corresponding to the G color, and the unit pixels 100 corresponding to the B color are each configured so that the number of unit pixels 100 having the MEMs 102 arranged in a first position and the number of unit pixels 100 having the MEMs 102 arranged in a second position different from the first position in the depth direction of the substrate are approximately equal to each other. With this configuration, two types of signals having different characteristics can be output for each color and the difference between the signals can be extracted for each color. Thus, the difference can be used as correction data in signal processing. In this case, it is not necessary to use this configuration for all the RGB colors. The configuration may be used only for one color (for example, the G color).

A photoelectric conversion apparatus according to a second exemplary embodiment will be described next. The present exemplary embodiment differs from the first exemplary embodiment in the charge transfer path from the PD 101 to the MEM 102.

FIG. 4 is a schematic diagram illustrating a cross-sectional structure of a part of the pixel region 10 including two adjacent ones of the unit pixels 100. FIG. 4 and FIGS. 5A to 5C schematically illustrate the structure of the cross section and the structures on the rear side of the cross section. The basic structure is similar to that according to the first exemplary embodiment and thus the description thereof will be omitted. A difference from the first exemplary embodiment will be mainly described.

Referring to the cross section illustrated in FIG. 4, the MEM 102a corresponding to the PD 101a included in one of the adjacent unit pixels 100 is formed on the wiring layer 212 side of the semiconductor layer 211. The MEM 102b corresponding to the PD 101b in the other unit pixel 100 is arranged at a position closer to the light incidence surface side of the semiconductor layer 211 than the MEM 102a. Referring to FIG. 5C, the MEMs 102a and 102b are formed to partially overlap each other in the depth direction in a state where a region for separating the MEMs 102a and 102b is provided between the overlapping parts of the MEMs 102a and 102b.

The difference from the first exemplary embodiment will be described next. In the present exemplary embodiment, the first transfer transistor 105b corresponding to the PD 101b has a vertical transfer structure that is formed by forming the gate insulating film 109 in a trench provided in the semiconductor layer 211 and then embedding an electrode material such as polysilicon therein. Likewise, the second transfer transistor 106b, the reset transistor 107, the selection transistor 108, and the amplification portion 104 can also be formed by using the vertical transfer structure.

A photoelectric conversion apparatus according to a third exemplary embodiment will be described next. The photoelectric conversion apparatus according to the present exemplary embodiment is a front-illuminated CMOS image sensor (imaging apparatus).

Figure 7A:
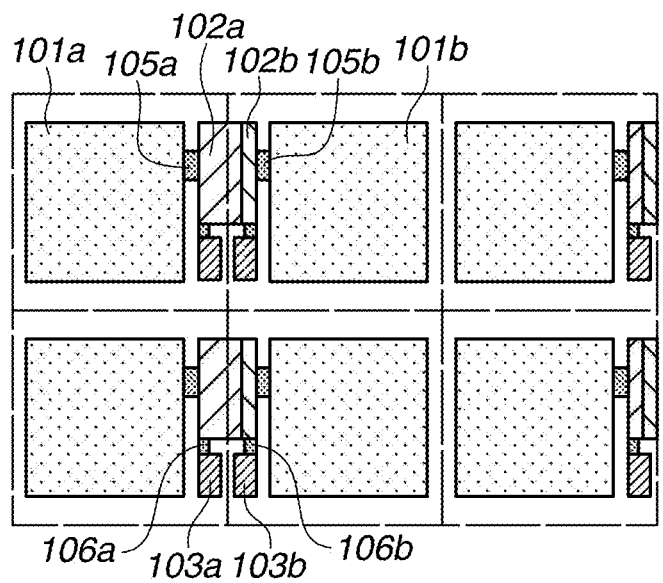
FIGS. 7A to 7C are schematic diagrams each illustrating a planar structure of the pixel region of the photoelectric conversion apparatus according to the third exemplary embodiment.
Figure 7B:
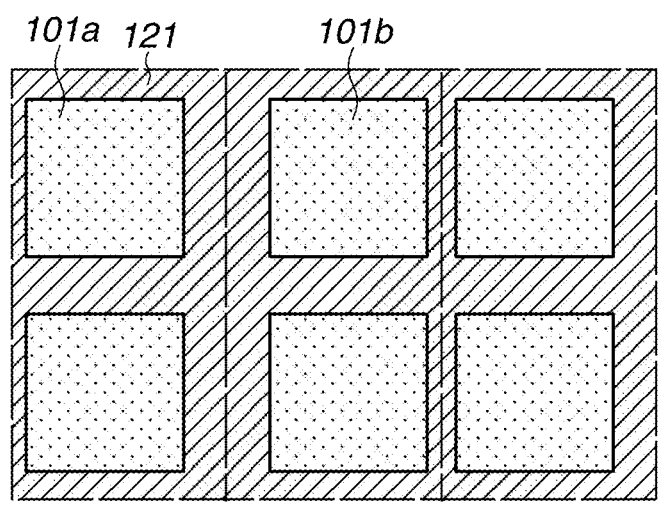
Figure 7C:
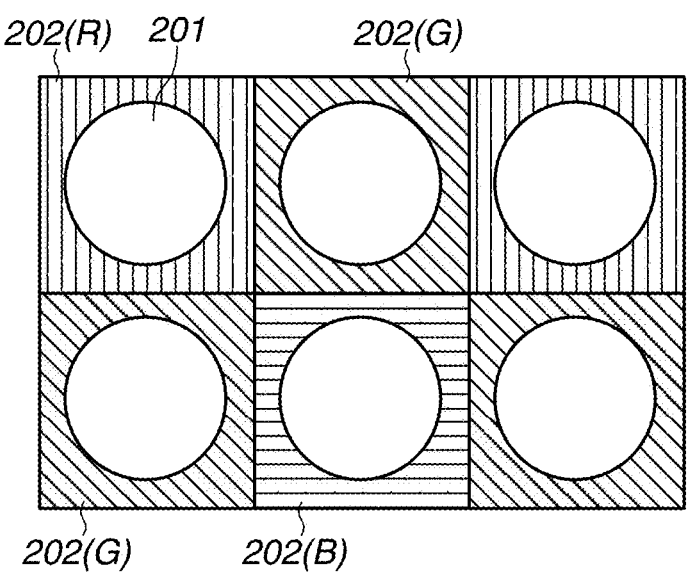

FIG. 6 is a schematic diagram illustrating a cross-sectional structure of a part of the pixel region 10 including two adjacent ones of the unit pixels 100. FIGS. 7A to 7C each schematically illustrate a planar structure of a part of the pixel region 10 including two or more of the unit pixels 100, which is viewed from the light incidence side. FIGS. 7A to 7C correspond to cross sections taken along section lines (a) to (c) in FIG. 6, respectively, and FIGS. 6 and 7A to 7C schematically illustrate the structures of the cross sections. The basic structure is similar to that according to the first exemplary embodiment, and thus the description thereof will be omitted. Differences from the first exemplary embodiment will be mainly described.

The photoelectric conversion apparatus according to the present exemplary embodiment is a front-illuminated CMOS image sensor.

The micro lenses 201 and the color filters 202 are formed on the light incidence side of the wiring layer 212. The region between the color filters 202 and the wirings 121 is flattened by the interlayer insulating film 122.

The wiring layer 212 is formed on the light incidence side of the semiconductor layer 211, and the plurality of wirings 121 for controlling the gate voltages of the transistors disposed in the semiconductor layer 211 and for reading the signal charges generated by photoelectric conversion is embedded in the interlayer insulating film 122.

The gate electrodes 110 are disposed between the wirings 121 in the wiring layer 212 and the semiconductor layer 211 via the gate insulating films 109, and the first transfer transistors 105 (105a and 105b) are each formed between the PD 101 and the MEM 102. When a predetermined voltage is applied to the gate electrodes 110 of the first transfer transistors 105, the charges generated by the PDs 101 are transferred to the MEMs 102. The gate insulating films 109 are formed of a material such as silicon oxide, and the gate electrodes 110 are formed of a material such as polysilicon.

When viewed from the light incidence side, the light shielding layer 204 is formed in the wiring layer 212 so as to entirely cover the MEMs 102 and the gate electrodes 110 of the first transfer transistors 105. The light shielding layer 204 is sectionally formed between the semiconductor layer 211 and the wirings 121 and between the gate electrodes 110 and the wirings 121 via the interlayer insulating film 122 formed of a material such as silicon oxide. As the light shielding layer 204, a light-shielding conductor formed of a material such as tungsten or aluminum is used.

The semiconductor layer 211 is formed to include the PDs 101, the MEMs 102, and the FDs 103, which are n-type semiconductor regions.

The MEM 102a corresponding to the PD 101a in one of the adjacent unit pixels 100 is formed on the wiring layer 212 side (light incidence side) of the semiconductor layer 211. The MEM 102b corresponding to the PD 101b in the other unit pixel 100 is formed at a position closer to the surface of the semiconductor layer 211 opposite to the light incidence surface than the MEM 102a. Referring to FIG. 7A, the MEMs 102a and 102b are formed to at least partially overlap each other in the depth direction of the substrate in a state where a region for separating the MEMs 102a and 102b is provided between the overlapping parts of the MEMs 102a and 102b. Impurities are doped between the overlapping parts of the MEMs 102a and 102b and between the surface of the semiconductor layer 211 opposite to the light incidence surface and the MEM 102b in order to provide a p-type region for separating the MEMs 102.

The first transfer transistor 105b corresponding to the PD 101b has a vertical transfer structure that is formed by forming the gate insulating film 109 in a trench provided in the semiconductor layer 211 and then embedding an electrode material such as polysilicon therein. Likewise, the second transfer transistor 106b is also disposed by using the vertical transfer structure. The FDs 103 are arranged on the wiring layer 212 side of the semiconductor layer 211. While in the present exemplary embodiment, the FDs 103 are formed of n-type impurity regions, the FDs 103 may be formed of the wiring capacitance of the wirings 121 in the wiring layer 212.

A photoelectric conversion apparatus according to a fourth exemplary embodiment will be described next. In the present exemplary embodiment, not only the MEMs 102 but also the MEMs 102 and the FDs 103 in the adjacent unit pixels 100 are formed to partially overlap each other in the depth direction of the semiconductor substrate (semiconductor layer 211) in a state where a region for separating the MEMs 102 and the FDs 103 is provided between the overlapping parts of the MEMs 102 and the FDs 103.

FIG. 8 is a schematic diagram illustrating a cross-sectional structure of a part of the pixel region 10 including two adjacent ones of the unit pixels 100. FIGS. 9A to 9E each schematically illustrate a planar structure of a part of the pixel region 10 including two or more of the unit pixels 100, which is viewed from the light incidence side. FIGS. 9A to 9E correspond to cross sections taken along section lines (a) to (e) in FIG. 8, respectively, and FIGS. 8 and 9A to 9E schematically illustrate the structures of the cross sections. The basic structure is similar to that according to the first exemplary embodiment, and thus the description thereof will be omitted. Differences from the first exemplary embodiment will be mainly described. As an example of the photoelectric conversion apparatus according to the present exemplary embodiment, a back-side illuminated CMOS image sensor (imaging apparatus) will be described.

Figure 9A:
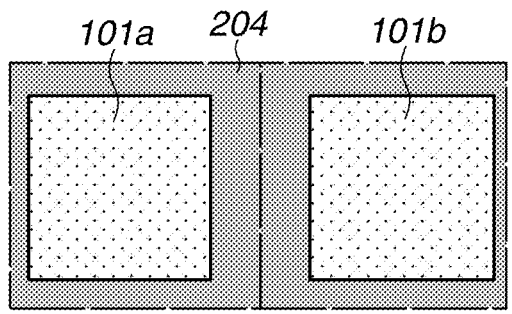
FIGS. 9A to 9E are schematic diagrams each illustrating a planar structure of the pixel region of the photoelectric conversion apparatus according to the fourth exemplary embodiment.
Figure 9B:
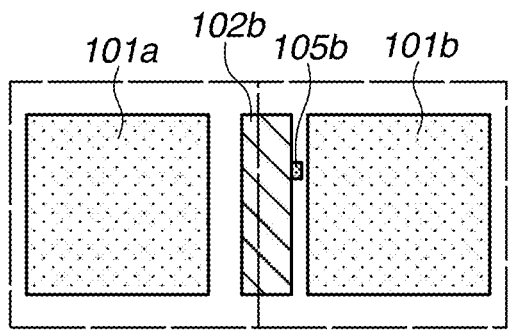
Figure 9C:
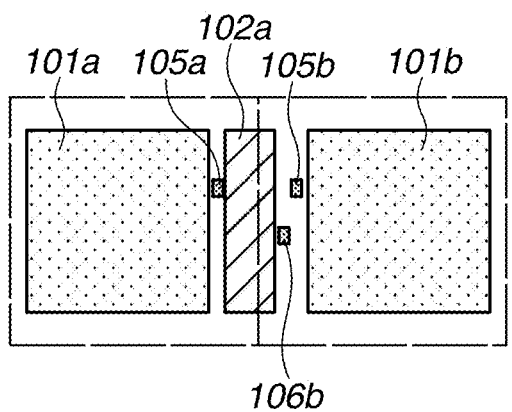
Figure 9D:
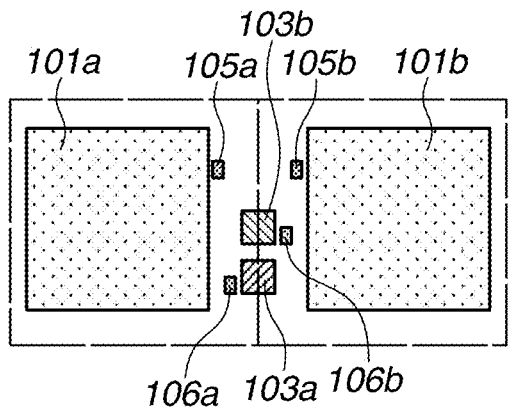
Figure 9E:
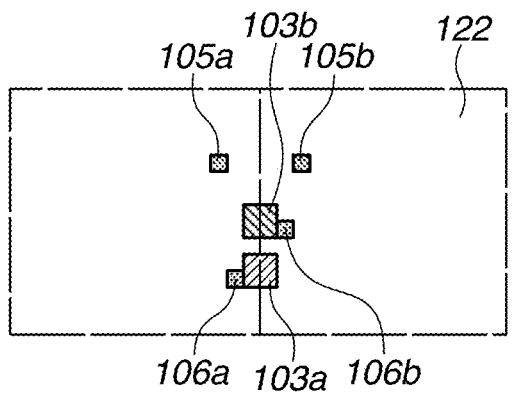

The FDs 103a and 103b in the adjacent unit pixels 100 are formed on the wiring layer 212 side of the semiconductor layer 211. As illustrated in FIG. 8, the MEM 102a corresponding to the PD 101a and the FD 103a is arranged at a position closer to the light incidence side of the semiconductor layer 211 than the FDs 103a and 103b. As illustrated in FIGS. 9B to 9D, the MEM 102a is formed so as to partially overlap the FD 103b and the MEM 102b in the depth direction of the substrate. In addition, as illustrated in FIG. 8, the MEM 102b corresponding to the PD 101b and the FD 103b is arranged at a position closer to the light incidence side of the semiconductor layer 211 than the MEM 102a. As illustrated in FIGS. 9B to 9D, the MEM 102b is formed so as to partially overlap the FD 103a and the MEM 102a in the depth direction of the substrate. Impurities are doped between the overlapping parts of the FDs 103a and 103b and the MEM 102a and between the overlapping parts of the MEMs 102a and 102b with respect to the depth direction of the substrate, so that p-type regions for separating the MEMs 102 and for separating the MEMs 102 and the FDs 103 are provided therebetween. The p-type regions have a conductivity type different from that of the MEMs 102 and the FDs 103. Alternatively, one FD 103 may be shared by the two adjacent unit pixels 100. Furthermore, two of four adjacent ones of the unit pixels 100 may share one FD 103 and the other two may share one FD 103. The shared FDs 103 may overlap each other in the depth direction of the substrate in a state where a region for separating the FDs 103 is provided therebetween.

The first transfer transistors 105a and 105b and the second transfer transistors 106a and 106b each have a vertical transfer structure that is formed by forming the gate insulating film 109 in a trench provided in the semiconductor layer 211 and then embedding an electrode material such as polysilicon therein.

As described above, the component arrangement efficiency can be further enhanced by arranging the MEMs 102a and 102b and the FDs 103a and 103b in the adjacent unit pixels 100 so as to partially overlap one another in the depth direction of the semiconductor layer 211 (depth direction of the substrate). With this configuration, the region occupied by the PD 101, i.e., the photoelectric conversion region can be increased as compared with a conventional configuration where the unit pixels 100 are arranged with the same pitches. In addition, the configuration makes it possible to increase the region occupied by the MEM 102, i.e., the charge holding capacity, thereby increasing the photoelectric conversion sensitivity and the charge amount that can be accumulated. Furthermore, the configuration reduces the region that requires light shielding by the light shielding layer 204, making it possible to increase the aperture ratio of the light incidence surface of the PD 101, thereby further enhancing the photoelectric conversion efficiency.

A photoelectric conversion apparatus according to a fifth exemplary embodiment will be described. In the photoelectric conversion apparatus according to the present exemplary embodiment, each of the unit pixels 100 includes a plurality of the photoelectric conversion portions 101, and a plurality of the MEMs 102 in each of the unit pixels 100 is formed to partially overlap each other in the depth direction of the semiconductor substrate in a state where a region for separating the MEMs 102 is provided between the overlapping parts of the MEMs 102. The photoelectric conversion apparatus according to the present exemplary embodiment is also an imaging apparatus.

Figure 11A:
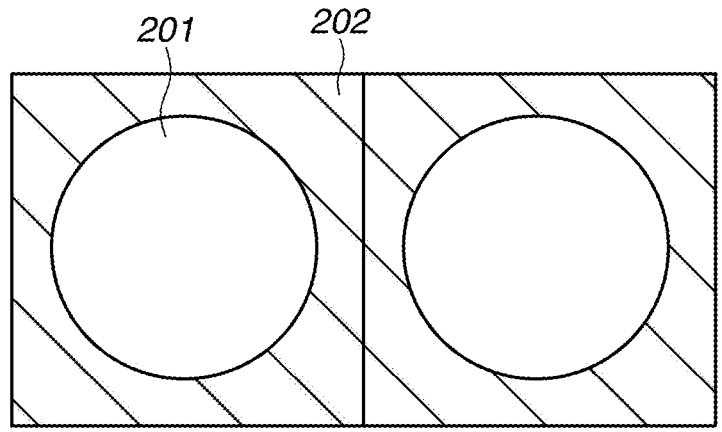
FIGS. 11A to 11C are schematic diagrams each illustrating a planar structure of the pixel region of the photoelectric conversion apparatus according to the fifth exemplary embodiment.
Figure 11B:
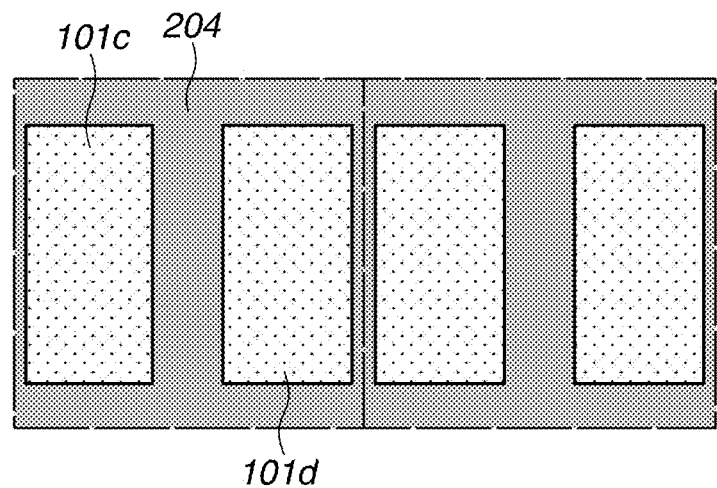
Figure 11C:
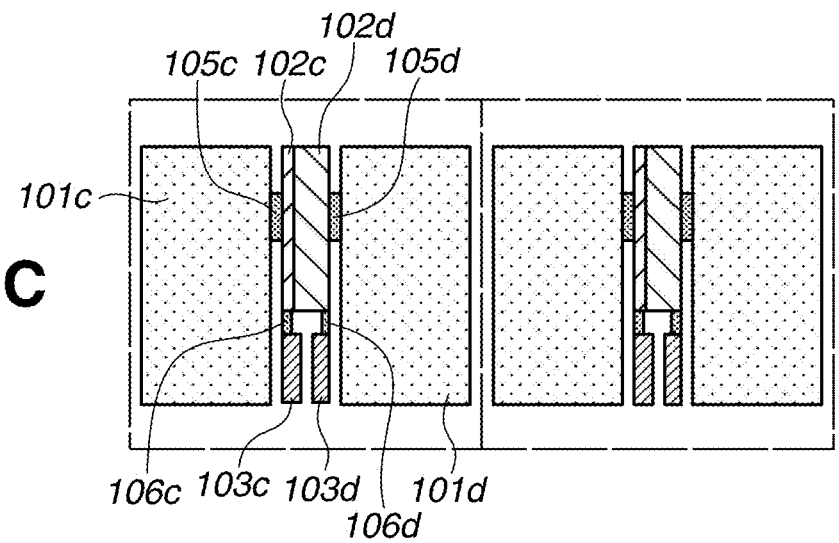
Figure 12:
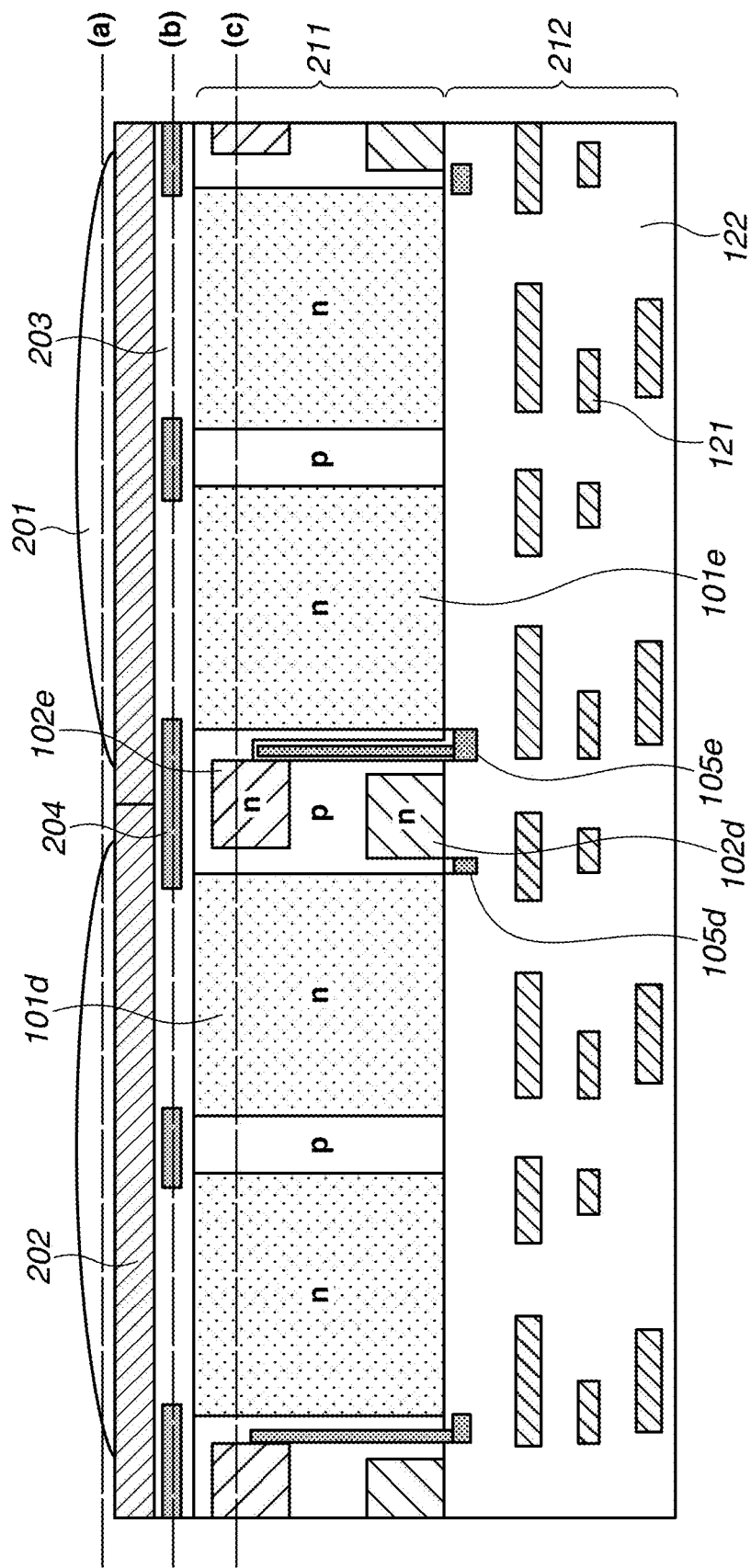
FIG. 12 is schematic diagram illustrating another example of the cross-sectional structure of the pixel region of the photoelectric conversion apparatus according to the fifth exemplary embodiment.
Figure 13A:
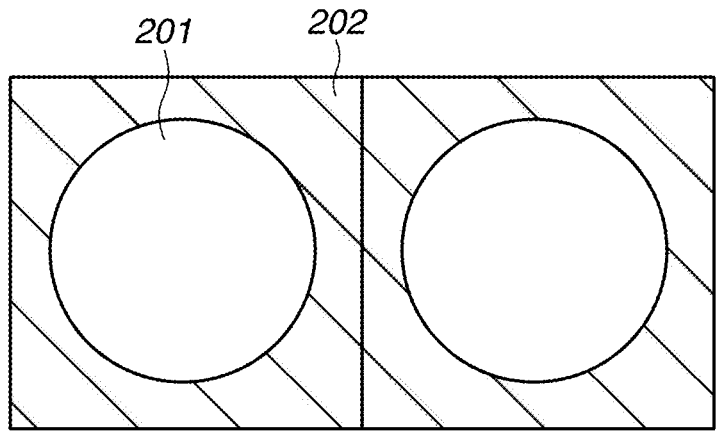
FIGS. 13A to 13C are schematic diagrams each illustrating another example of the planar structure of the pixel region of the photoelectric conversion apparatus according to the fifth exemplary embodiment.
Figure 13B:
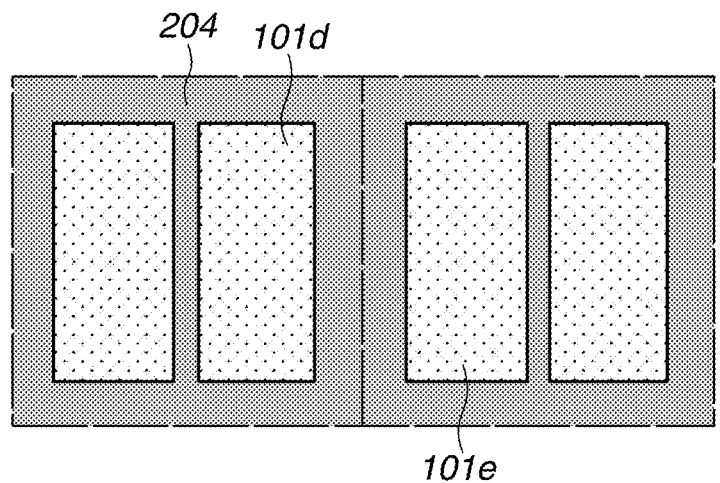
Figure 13C:
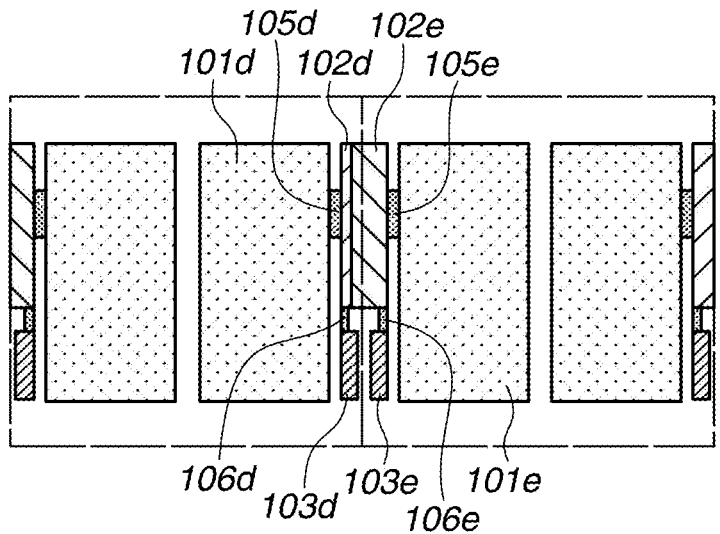

FIG. 10 is a schematic diagram illustrating a cross-sectional structure of a part of the pixel region 10 including two adjacent ones of the unit pixels 100. FIGS. 11A to 11C each schematically illustrate a planar structure of a part of the pixel region 10 including two or more of the unit pixels 100, which is viewed from the light incidence surface side. FIGS. 11A to 11C correspond to cross sections taken along section lines (a) to (c) in FIG. 10, respectively, and FIGS. 10 and 11A to 11C schematically illustrate the structures of the cross sections. The basic structure is similar to that according to the first exemplary embodiment, and thus the description thereof will be omitted. Differences from the first exemplary embodiment will be mainly described.

In the present exemplary embodiment, two unit pixels 100 having the same configuration as that illustrated in FIG. 2 are arranged as sub pixels for each of the micro lenses 201. One color filter 202 is disposed for each of the micro lenses 201. The color filters 202 may be arranged in a Bayer array, similarly to the first exemplary embodiment. Alternatively, monochromatic color filters or color filters of more colors may be used.

Similarly to the first exemplary embodiment, the light shielding layer 204 is disposed between the color filters 202 and the semiconductor layer 211. The light shielding layer 204 has openings corresponding to the light incidence surfaces of the PDs 101 (101c and 101d) as illustrated in FIG. 11B, and is formed so as to cover the MEMs 102 (102c and 102d) and the FDs 103 (103c and 103d).

The PDs 101c and 101d in the adjacent unit pixels 100 are arranged to share the micro lens 201. The respective signals read from the PDs 101c and 101d are used to detect the phase difference between two images, and a combination of the signals read from the PDs 101c and 101d is used as an imaging signal of one pixel.

In this example, the MEM 102c corresponding to the PD 101c in one of the adjacent unit pixels 100 is formed on the wiring layer 212 side of the semiconductor layer 211 illustrated in FIG. 10. The MEM 102d corresponding to the PD 101d in the other unit pixel 100 is arranged at a position closer to the light incidence surface side of the semiconductor layer 211 than the MEM 102c. As illustrated in FIG. 11C, the MEMs 102c and 102d are formed so as to partially overlap each other in the depth direction of the substrate.

Also in the present exemplary embodiment, a p-type semiconductor region for separating the MEMs 102c and 102d, which has a conductivity type different from that of the MEMs 102c and 102d, is provided between the overlapping parts of the MEMs 102c and 102d with respect to the depth direction of the substrate. In the above-described configuration, the MEMs 102c and 102d in the adjacent unit pixels 100 sharing the micro lens 201 are arranged, positioned, or disposed to overlap each other in the depth direction of the substrate. Alternatively, as illustrated in FIGS. 12 and 13A to 13C, the MEMs 102d and 102e in the adjacent unit pixels 100 not sharing the micro lens 201 may be arranged, positioned, or disposed to overlap each other in the depth direction of the substrate. The present exemplary embodiment is also applicable to the FDs 103 in the adjacent unit pixels 100, and the MEMs 102 and the FDs 103 in the adjacent unit pixels 100.

A photoelectric conversion apparatus according to a sixth exemplary embodiment will be described next. In the photoelectric conversion apparatus according to the present exemplary embodiment, each of the unit pixels 100 includes a plurality of the photoelectric conversion portions 101 having different sizes, and the MEMs 102 in the adjacent unit pixels 100 are formed to partially overlap each other in the depth direction of the semiconductor substrate (semiconductor layer 211) in a state where a region for separating the MEMs 102 is provided between the overlapping parts of the MEMs 102.

Figure 15A:
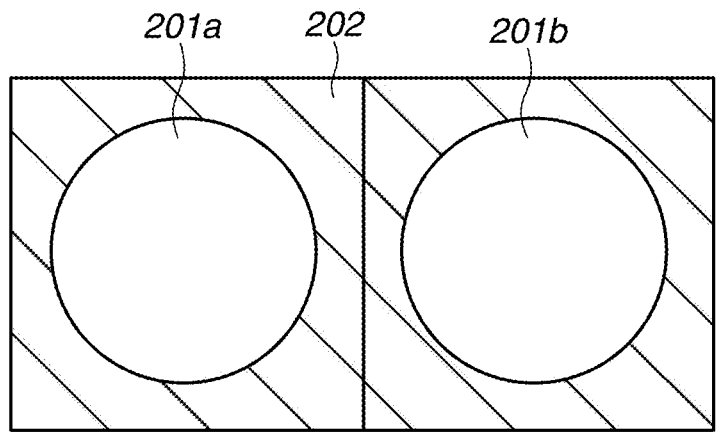
FIGS. 15A to 15C are schematic diagrams each illustrating a planar structure of the pixel region of the photoelectric conversion apparatus according to the sixth exemplary embodiment.
Figure 15B:
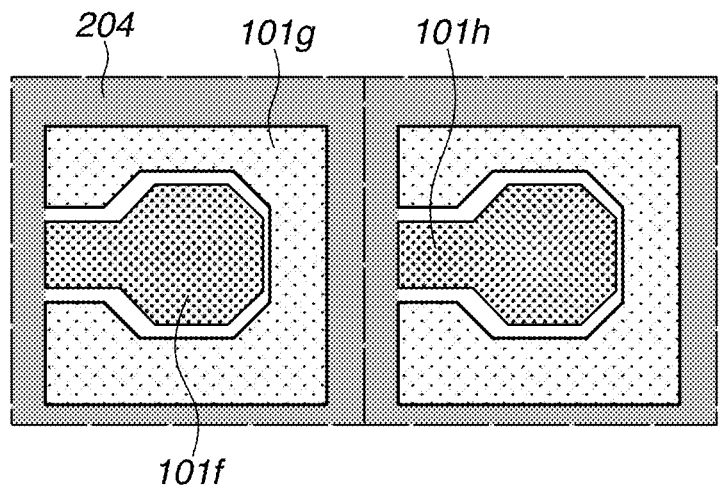
Figure 15C:
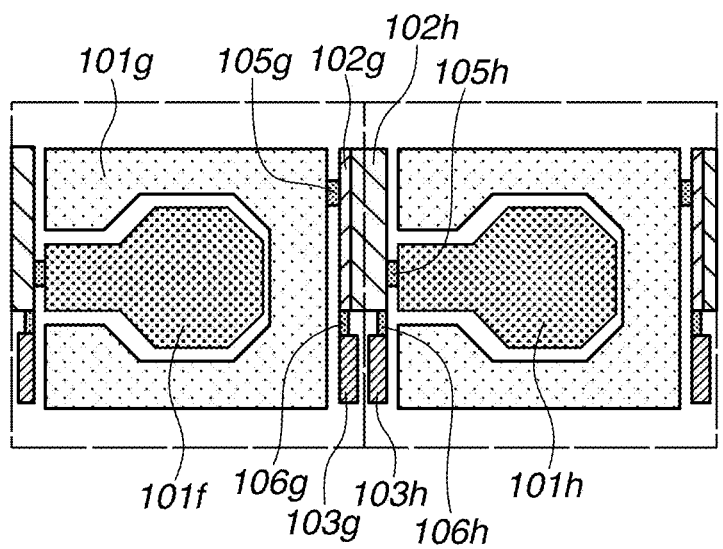

FIG. 14 is a schematic diagram illustrating a cross-sectional structure of a part of the pixel region 10 including two adjacent ones of the unit pixels 100. FIGS. 15A to 15C each schematically illustrate a planar structure of a part of the pixel region 10 including two or more of the unit pixels 100, which is viewed from the light incidence side. FIGS. 15A to 15C correspond to cross sections taken along section lines (a) to (c) in FIG. 14, respectively, and FIGS. 14 and 15A to 15C schematically illustrate the structures of the cross sections. The basic structure is similar to that according to the first exemplary embodiment, and thus the description thereof will be omitted. Differences from the first exemplary embodiment will be mainly described.

Similarly to the first exemplary embodiment, the light shielding layer 204 is sectionally disposed between the color filters 202 and the semiconductor layer 211. The light shielding layer 204 planarly has openings corresponding to the light incidence surfaces of the PDs 101 as illustrated in FIG. 15B, and is formed so as to cover the MEMs 102 and the FDs 103.

The PDs 101f and 101g are arranged to share the micro lens 201. As illustrated in FIG. 15B, the PD 101f is arranged in a region close to the optical center (optical axis) of the micro lens 201, while the PD 101g is arranged in a region close to the periphery of the micro lens 201 (a region apart from the optical axis). A low-sensitivity pixel close to the optical center and a high-sensitivity pixel apart from the optical center are formed by making the area of the PD 101g larger than the area of the PD 101f. High image quality with an expanded dynamic range can be achieved by combining a low-sensitivity signal read from the PD 101f and a high-sensitivity signal read from the PD 101g.

In the present exemplary embodiment, the MEM 102g corresponding to the PD 101g forming a high-sensitivity pixel, and the MEM 102h corresponding to the PD 101h forming a low-sensitivity pixel arranged at the adjacent micro lens 201 are formed to overlap each other in the depth direction of the substrate. The MEM 102g corresponding to the PD 101g is formed on the wiring layer 212 side of the semiconductor layer 211 illustrated in FIG. 14. The MEM 102h corresponding to the PD 101h is arranged at a position closer to the light incidence surface side of the semiconductor layer 211 than the MEM 102g. As illustrated in FIG. 15C, the MEMs 102g and 102h are formed so as to partially overlap each other in the depth direction. The FDs 103 (103g and 103h) are arranged on the wiring layer 212 side of the semiconductor layer 211.

In the above-described configuration, at least parts of the MEMs 102 in the adjacent unit pixels 100 are arranged, positioned, or disposed to overlap each other in the depth direction of the substrate. Alternatively, in one unit pixel 100, at least parts of the MEMs 102h and 102g corresponding to the PDs 101f and 101g, respectively, may be arranged, positioned, or disposed to overlap each other in the depth direction of the substrate. In either configuration, a p-type semiconductor region for separating the MEMs 102g and 102h, which has a conductivity type different from that of the MEMs 102g and 102h, is provided between at least parts of the MEMs 102g and 102h overlapping in the depth direction of the substrate.

A photoelectric conversion apparatus according to a seventh exemplary embodiment will be described next. In the photoelectric conversion apparatus according to the present exemplary embodiment, each of the unit pixels 100 includes a plurality of the MEMs 102, and the MEMs 102 are formed to partially overlap each other in the depth direction of the semiconductor substrate (semiconductor layer 211) in a state where a region for separating the MEMs 102 is provided between the overlapping parts of the MEMs 102. The photoelectric conversion apparatus according to the present exemplary embodiment is also an imaging apparatus.

Figure 17A:
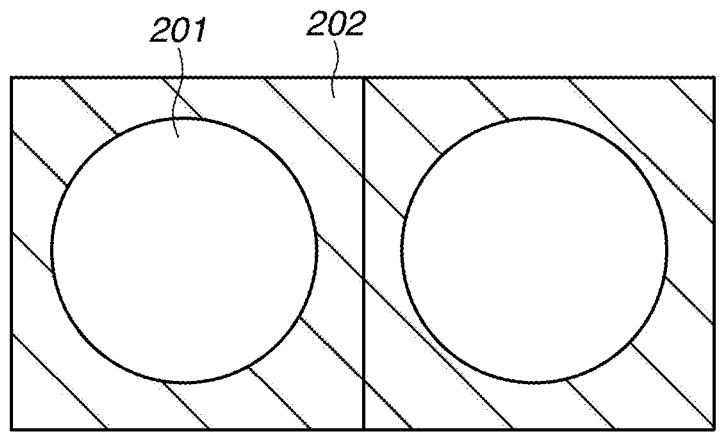
FIGS. 17A to 17C are schematic diagrams each illustrating a planar structure of the pixel region of the photoelectric conversion apparatus according to the seventh exemplary embodiment.
Figure 17B:
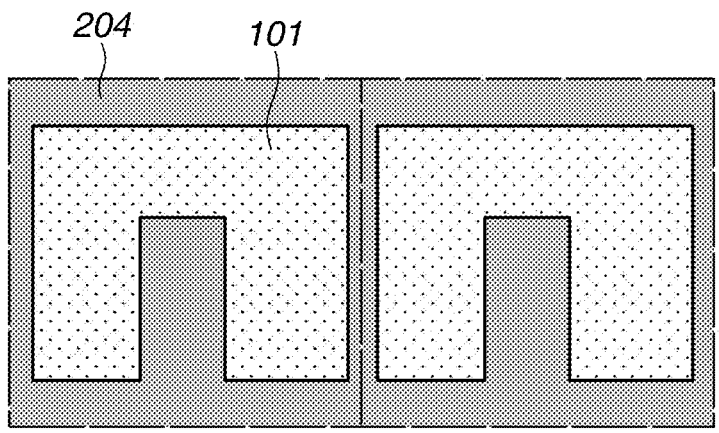
Figure 17C:
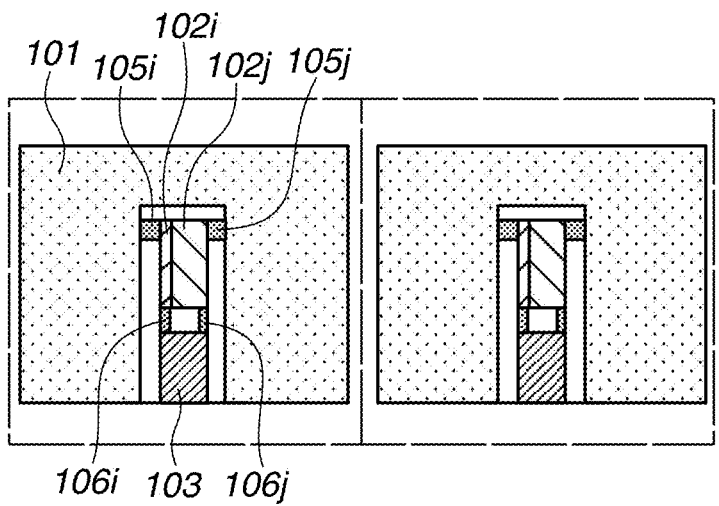

FIG. 16 is a schematic diagram illustrating a cross-sectional structure of a part of the pixel region 10 including two adjacent ones of the unit pixels 100. FIGS. 17A to 17C each schematically illustrate a planar structure of a part of the pixel region 10 including two or more of the unit pixels 100, which is viewed from the light incidence side. FIGS. 17A to 17C correspond to cross sections taken along section lines (a) to (c) in FIG. 16, respectively, and FIGS. 16 and 17A to 17C schematically illustrate the structures of the cross sections. The basic structure is similar to that according to the first exemplary embodiment, and thus the redundant description thereof will be omitted. Differences from the first exemplary embodiment will be mainly described.

In the present exemplary embodiment, one PD 101, two MEMs 102 (102i and 102j), and one FD 103 are arranged for each unit pixel 100. Both the MEMs 102i and 102j have an n-conductivity type and accumulate the charges generated by the PD 101. Holding the generated charges in these two different MEMs 102 allows the charge holding capacity for each exposure to be variable.

The charges are transferred from the PD 101 to the MEM 102i (first charge holding portion) via the first transfer transistor 105i. The charges are transferred from the PD 101 to the MEM 102j (second charge holding portion) via the first transfer transistor 105j.

The MEM 102i transfers the charges to the FD 103 via the second transfer transistor 106i, and the MEM 102j transfers the charges to the FD 103 via the second transfer transistor 106j.

In the present exemplary embodiment, the MEMs 102i and 102j are formed to overlap each other in the depth direction of the semiconductor substrate in a state where a p-type semiconductor region for separating the MEMs 102i and 102j is provided between the overlapping parts of the MEMs 102i and 102j. The above-described arrangement makes it possible to enhance the component arrangement efficiency and increase the photoelectric conversion region, as compared with a case where the MEMs 102i and 102j are arranged so as not to overlap in the depth direction.

Figure 18:
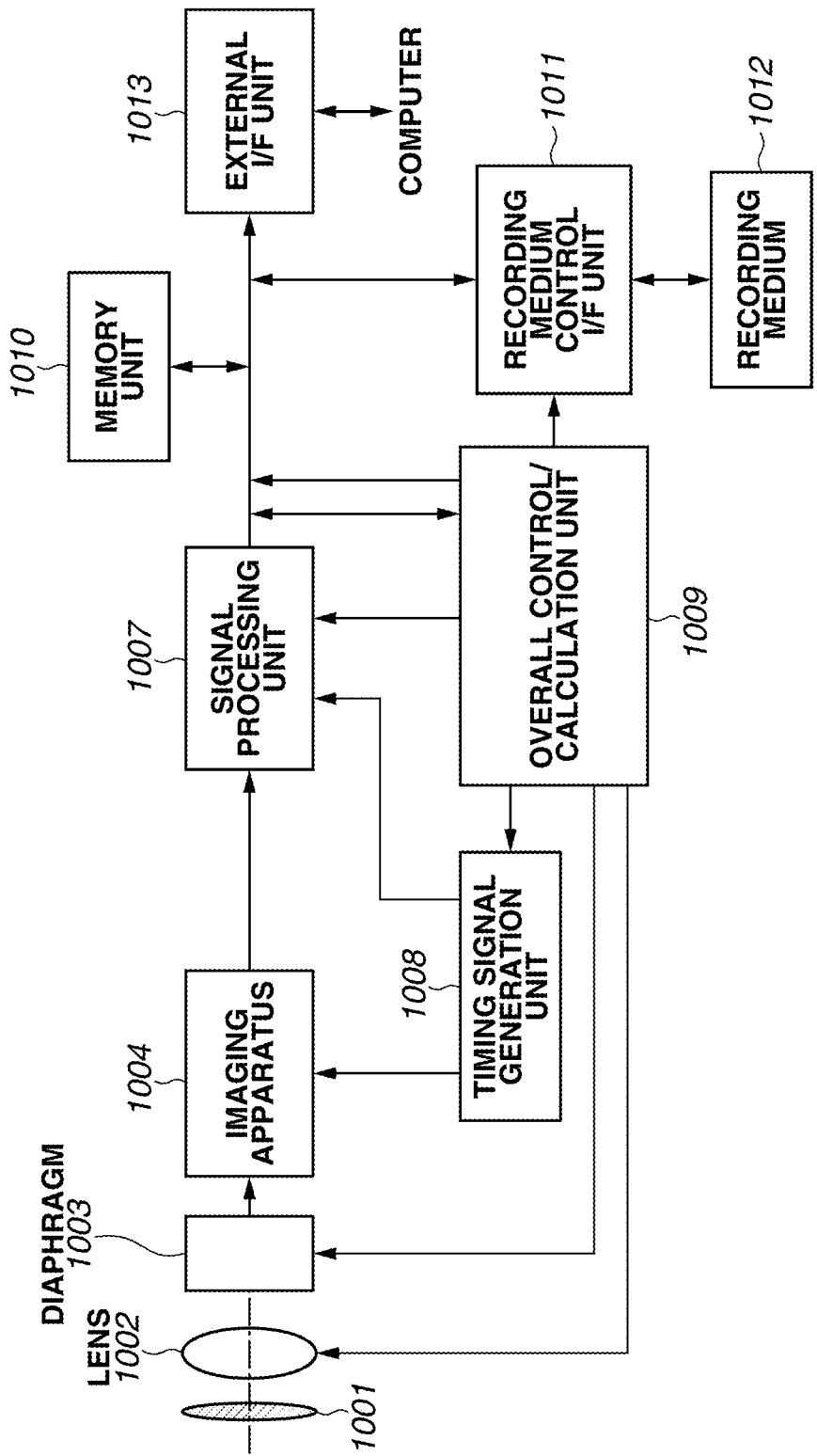
FIG. 18 is a block diagram illustrating a schematic configuration of an imaging system according to an eighth exemplary embodiment.

An imaging system according to an eighth exemplary embodiment will be described next. Examples of the imaging system include digital still cameras, digital camcorders, camera heads, copying machines, facsimiles, mobile phones, on-vehicle cameras, and observation satellites. FIG. 18 is a block diagram illustrating a digital still camera as an example of the imaging system.

Referring to FIG. 18, a barrier 1001 protects a lens 1002. The lens 1002 forms an optical image of a subject on an imaging apparatus 1004. A diaphragm 1003 varies the amount of light that has passed through the lens 1002. As the imaging apparatus 1004, the imaging apparatus according to any of the above-described exemplary embodiments is used.

A signal processing unit 1007 subjects the pixel signal output from the imaging apparatus 1004 to correction, data compression, and other processing to acquire an image signal. Referring to FIG. 18, a timing signal generation unit 1008 outputs various timing signals to the imaging apparatus 1004 and the signal processing unit 1007. An overall control/calculation unit 1009 controls the entire digital still camera. A memory unit 1010 is a frame memory unit for temporarily storing image data. A recording medium control I/F unit 1011 records or reads data to or from a recording medium 1012. The recording medium 1012, such as a semiconductor memory, is used to record or read captured image data, and is attachable to and detachable from the digital still camera. An external I/F unit 1013 communicates with an external computer.

The imaging system needs to include at least the imaging apparatus 1004 and the signal processing unit 1007 for processing the pixel signal output from the imaging apparatus 1004. In this case, the other components may be disposed outside the imaging system.

As described above, the imaging system according to the present exemplary embodiment uses the imaging apparatus according to any of the first to seventh exemplary embodiments as the imaging apparatus 1004. Such a configuration makes it possible to expand the dynamic range of images obtained by the imaging apparatus 1004.

Figure 19A:
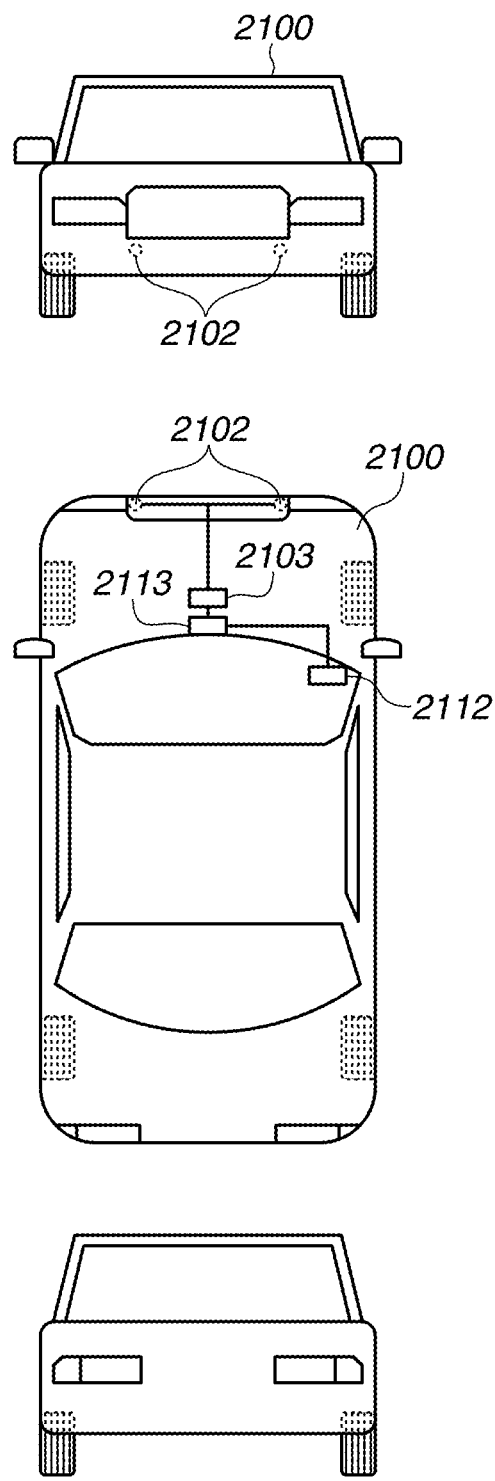
FIGS. 19A and 19B are diagrams illustrating configuration examples of an imaging system and a movable body according to a ninth exemplary embodiment.
Figure 19B:
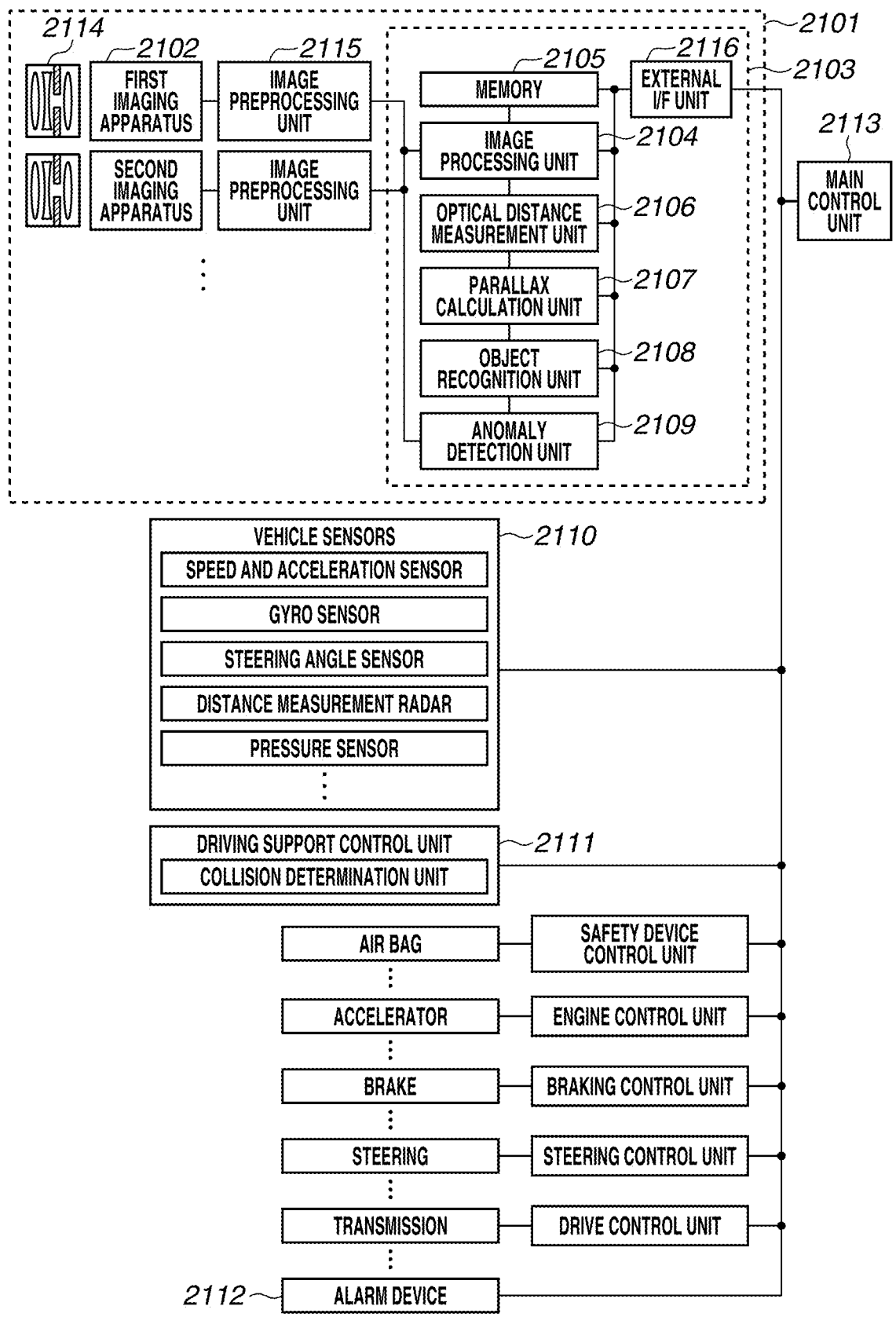

A movable body according to a ninth exemplary embodiment will be described next. The movable body according to the present exemplary embodiment is an automobile having an on-vehicle camera. FIGS. 19A and 19B schematically illustrate the outer appearance and main inner structure of an automobile 2100, respectively. The automobile 2100 includes an imaging apparatus 2102, an imaging system application specific integrated circuit (ASIC) 2103, an alarm device 2112, and a main control unit 2113.

The imaging apparatus according to any of the above-described exemplary embodiments is used as the imaging apparatus 2102. The alarm device 2112 warns the driver upon reception of an anomaly signal from an imaging system 2101, vehicle sensors, control units, or the like. The main control unit 2113 controls the entire operations of the imaging system 2101, the vehicle sensors, and the control units. The automobile 2100 may not include the main control unit 2113. In this case, each of the imaging system 2101, the vehicle sensors, and the control units includes a communication interface, and transmits and receives control signals via a communication network (based on, for example, the Controller Area Network (CAN) standard).

FIG. 19B is a block diagram illustrating a system configuration of the automobile 2100. The automobile 2100 includes the imaging apparatus 2102 including a first imaging apparatus and a second imaging apparatus. In other words, the on-vehicle camera according to the present exemplary embodiment is a stereo camera. A subject image is formed on the imaging apparatus 2102 by optical units 2114. The pixel signals output from the imaging apparatus 2102 are processed by image preprocessing units 2115 and then transmitted to the imaging system ASIC 2103. The image preprocessing unit 2115 performs processing such as signal-to-noise (S/N) calculation and synchronization signal addition.

The imaging system ASIC 2103 includes an image processing unit 2104, a memory 2105, an optical distance measurement unit 2106, a parallax calculation unit 2107, an object recognition unit 2108, an anomaly detection unit 2109, and an external I/F unit 2116. The image processing unit 2104 processes the pixel signals to generate image signals. The image processing unit 2104 also corrects the image signals and complements defective pixels. The memory 2105 temporarily stores the image signals. The memory 2105 may store the positions of known defective pixels of the imaging apparatus 2102. The optical distance measurement unit 2106 uses the image signals to bring the subject into focus or measure the distance to the subject. The parallax calculation unit 2107 performs subject verification (stereo matching) with parallax images. The object recognition unit 2108 analyzes the image signals to recognize the subject such as an automobile, a person, a traffic sign, or a road. The anomaly detection unit 2109 detects a failure or malfunction of the imaging apparatus 2102. When detecting a failure or malfunction, the anomaly detection unit 2109 transmits a signal indicating the detection of an anomaly to the main control unit 2113. The external I/F unit 2116 mediates information exchange between each component of the imaging system ASIC 2103 and the main control unit 2113 or the control units.

The automobile 2100 includes a vehicle information acquisition unit 2110 and a driving support control unit 2111. The vehicle information acquisition unit 2110 includes the vehicle sensors such as a speed and acceleration sensor, a gyro sensor, a steering angle sensor, a distance measurement radar, and a pressure sensor.

The driving support control unit 2111 includes a collision determination unit that determines whether there is a possibility of collision with an object based on information from the optical distance measurement unit 2106, the parallax calculation unit 2107, and the object recognition unit 2108. The optical distance measurement unit 2106 and the parallax calculation unit 2107 are examples of distance information acquisition units for acquiring information about the distance to the subject. More specifically, the distance information includes information about the parallax, the defocus amount, and the distance to the subject. The collision determination unit may determine the possibility of collision by using one of these pieces of distance information. The distance information acquisition unit may be implemented by specially designed hardware or a software module.

While in the present exemplary embodiment, the example in which the driving support control unit 2111 controls the automobile 2100 so as to avoid a collision with other vehicles has been described, the present exemplary embodiment is also applicable to automatic driving control for following another vehicle and automatic driving control for maintaining the vehicle within a lane.

The automobile 2100 is further provided with travelling driving units, such as an air bag, an accelerator, a brake, a steering, and a transmission. The automobile 2100 further includes the control units for these driving units. The control units control the corresponding driving units based on the control signals from the main control unit 2113.

The imaging system 2101 according to the present exemplary embodiment is applicable not only to automobiles but also to movable bodies (moving apparatuses) such as vessels, airplanes, and industrial robots. In addition, the imaging system 2101 according to the present exemplary embodiment is applicable not only to movable bodies but also to an intelligent transport system (ITS) and a wide range of apparatuses utilizing object recognition.

As described above, in the present exemplary embodiment, the imaging apparatus according to one of the first to seventh exemplary embodiments is used as the imaging apparatus 2102. Such a configuration makes it possible to expand the dynamic range of images obtained by the imaging apparatus 2102.

The exemplary embodiments of the disclosure make it possible to increase the area of the photoelectric conversion portion, thereby enhancing the sensitivity and dynamic range performance of the photoelectric conversion apparatus.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A photoelectric conversion apparatus comprising a plurality of pixels each including a plurality of sub pixels and a micro lens shared by the plurality of sub pixels, wherein each of the plurality of sub pixels includes, in a semiconductor layer of a substrate, a photoelectric conversion portion, a charge holding portion configured to hold charges generated by the photoelectric conversion portion, and a floating diffusion layer configured to convert the charges transferred from the charge holding portion into a voltage, and wherein at least parts of the charge holding portions and the floating diffusion layers are arranged to overlap each other between adjacent sub pixels among the plurality of pixels in a depth direction of the substrate in a state where a region for separating the at least parts of the charge holding portions and the floating diffusion layers is provided therebetween.

2. The photoelectric conversion apparatus according to claim 1, wherein the adjacent sub pixels includes the plurality of sub pixels that share the micro lens.

3. The photoelectric conversion apparatus according to claim 1, wherein the adjacent sub pixels include the sub pixels that are adjacent to each other, not included in a pixel of the plurality of pixels, and do not share a micro lens.

4. The photoelectric conversion apparatus according to claim 1, wherein the plurality of sub pixels are used to detect a phase difference between images.

5. The photoelectric conversion apparatus according to claim 1, wherein the plurality of sub pixels that share the micro lens are different in sensitivity from each other.

6. An imaging system comprising:
the photoelectric conversion apparatus according to claim 1; and
a processing apparatus configured to perform processing on a signal output from the photoelectric conversion apparatus.

7. A digital camera comprising:
the imaging system according to claim 6; and
a lens configured to project a subject image on the photoelectric conversion apparatus of the imaging system.

8. A movable body comprising:
the photoelectric conversion apparatus according to claim 1;
a processing apparatus configured to perform processing on a signal output from the photoelectric conversion apparatus; and
a control circuit to control the movable body based on a result of the processing.

* * * * *